(12) United States Patent
Unno

(10) Patent No.: US 7,508,598 B2
(45) Date of Patent: Mar. 24, 2009

(54) APPARATUS FOR MEASURING AERIAL IMAGES PRODUCED BY AN OPTICAL LITHOGRAPHY SYSTEM

(75) Inventor: Yasuyuki Unno, Irvine, CA (US)

(73) Assignee: Canon Kabushiki Kaisha, Tokyo (JP)

( * ) Notice: Subject to any disclaimer, the term of this patent is extended or adjusted under 35 U.S.C. 154(b) by 90 days.

(21) Appl. No.: 11/531,431

(22) Filed: Sep. 13, 2006

(65) Prior Publication Data

US 2008/0074758 A1    Mar. 27, 2008

(51) Int. Cl.
*G02B 9/00* (2006.01)
*G02B 9/08* (2006.01)
*G03B 27/72* (2006.01)

(52) U.S. Cl. .......................................... 359/738; 355/71
(58) Field of Classification Search ................ 359/738, 359/739, 483; 355/71
See application file for complete search history.

(56) References Cited

U.S. PATENT DOCUMENTS 5,631,731 A    5/1997   Sogard
5,866,935 A    2/1999   Sogard

*Primary Examiner*—Alicia M Harrington
(74) *Attorney, Agent, or Firm*—Canon USA Inc IP Division

(57) ABSTRACT

At least one exemplary embodiment is directed to detection aperture array which includes a shield layer; and a plurality of apertures, where the plurality of apertures are formed in the shield layer and filled with a first medium having an effective index of refraction, wherein the plurality of apertures includes at least two apertures separated by a pitch, wherein the plurality of apertures has a measurement value wherein the measurement value includes at least one of the effective refractive index and a pitch value, wherein the measurement value is changed so that TM and TE modes in incident image light passes through the plurality of apertures with about the same transmittance level, wherein when the measurement value is the pitch value then the TM and TE transmittance level are about the same when an angle of incidence of an image light varies.

14 Claims, 18 Drawing Sheets

APPARATUS FOR MEASURING AERIAL IMAGES PRODUCED BY AN OPTICAL LITHOGRAPHY SYSTEM

FIELD OF THE INVENTION

The present invention relates to a method/apparatus configured to measure and/or improve detected resolution and/or intensity of a sampled image. More particularly, though not exclusively, the present invention is related to aperture arrays and/or varying aperture properties to improve detection resolution and/or detection intensity of an image of a reticle pattern.

BACKGROUND OF THE INVENTION

FIG. 1 illustrates a conventional exposure apparatus 100 used for optical lithography. An illumination system 110 (e.g., ArF laser), illuminates (exposes) 120 a pattern 135 in a reticle 130. The patterned light (image light) 140, carrying an image 175 of the pattern 135, is projected 160 via a projection lens 150 onto a wafer 170, which has a photoresist layer (not shown) spin-coated thereon. The image light 160, which can pass through a medium 165 having a particular index of refraction (e.g., water), exposes the photoresist, which is then developed (non exposed photoresist removed for negative-type photoresist and exposed photoresist removed for positive-type photoresist) and etched (e.g., via plasma etching) to form structures in the wafer 170. The accuracy of the transfer of the pattern 135 of the reticle 130 into the wafer 170 depends on several quality issues. For example, aberrations that are residual in the projection lens can result in an image 175 that does not accurately represent the pattern 135 on the reticle. This is one reason that detectors are used to sample the image light 160 incident on a wafer 170.

The resolution R of the conventional system illustrated in FIG. 1 is determined by its projection lens 150 numerical aperture (NA) and the illumination (exposure) wavelength ($\lambda$). The relationship can be expressed as:

$$R=(k1\lambda)/NA \qquad (1)$$

where k1 is a process dependent factor (e.g., between 0.3-0.5). For example, a NA of over 1.0 can be obtained using an immersion system. ArF laser ($\lambda$=193 nm) is typically used as the illumination system. For an immersion system the space 165 between the projection lens 150 and the wafer 170 is filled with fluid. The fluid can be transparent to the illumination wavelength and have an index of refraction "n" greater than 1 (e.g., purified water n=1.44). Note that when the term fluid is referred to herein it can include liquids (e.g., water) and gases (e.g., air at various pressures).

One method of conventional detection to acquire the image accuracy is to expose the photoresist, develop the photoresist, and view it under a scanning electron microscope (SEM). However several photoresist properties in addition to the desire to sample the image directly have led to the development of sampling detection arrangements.

FIG. 2A illustrates a conventional one slit (aperture) sampling detection arrangement 200a (detector aperture) used to sample the image light to acquire a measure of the accuracy of the image 210a. The image light is incident on the detector aperture whereby a portion of the light is shielded from passage through the detector aperture by a shield layer 230a. The shield layer 230a can lie on a support substrate 240a, and has an opening (aperture) 220a through which light of a chosen wavelength can pass. The portion of image light 250a, which passes through the aperture, is detected by a detector 260a. To sample the entire image the detector aperture is moved 290 along with the detector 260a.

When using a single aperture, a non-periodic image (as opposed to the periodic image illustrated in FIG. 2A) can be detected. For example FIG. 2B illustrates a single slit system as illustrated in FIG. 2A, as applied to a non-periodic multiple intensity image 210b.

In the case of a periodic image in the scan direction a multi slit system can be used. FIG. 2C illustrates a conventional multi slit 220b (multi-aperture) image sampling detection arrangement 200b (detector aperture). This arrangement is similar to the single aperture arrangement but with multiple slits to sample a periodic image. Both arrangements can be moved to sample the entire image. Since the image is periodic, each aperture practically captures the same image portion. The arrangement in FIG. 2C allows more light, compared with the single slit arrangement in FIG. 2A, to be detected by the detector. Again the image 210c is sampled by a detector 260b that detects the portion of the image light 250b passing through the detector aperture 200b, i.e. the portion passing through the multi-apertures 220b. The other portions not being transmitted through the detector aperture 200b are shielded by the shield layer 230b, which is supported by the support substrate 240b.

In several conventional arrangements the aperture width (e.g., a slit width) is smaller than the image light wavelength so that image features can be detected. U.S. Pat. No. 5,631,731 discusses a single slit aperture arrangement and a multi-slit arrangement. Note that the term aperture is used to denote an opening, a slit, a hole, and any other type of region that allows a particular frequency of light to pass while other neighboring regions do not. Since the aperture width tends to be smaller than the wavelength of the image light, diffraction can occur upon exiting the aperture(s), adding to image detection errors at the detector (e.g., reduced accuracy, reduced intensity). Reduced accuracy of measurement can occur when different polarizations of the image light, each having different levels of contrast, are transmitted differently through the detector aperture. Reduced intensity can occur when only a portion of the diffracted light reaches the detector. Reduced intensity can also be a function of angle of incidence.

FIG. 3A illustrates the diffraction 370 of image light 330, incident to a normal of a surface at an angle theta ($\theta$), passing through a narrow slit aperture 320 of a detection aperture 300. The aperture width is "d" and is assumed to be less than the image light wavelength $\lambda$ 340. The thickness of the shield layer 310 is W1, and can vary depending upon the extinction characteristics of the material used for the shield layer 310. The image light 330 can have two polarizations, a Transverse Electric (TE) polarization 360a and a Transverse magnetic polarization (TM) 360b. The electric field of the TE mode 360a is substantially aligned with a chosen direction (e.g. along the long part of a slit), while the electric field of the TM mode 360b is aligned substantially perpendicular to the TE mode's field alignment. In a conventional exposure system (FIG. 1) the illumination beam is not polarized. In such a case, the image 175 is given as a superposition of the TE and TM polarization components (roughly 50% each). Thus, if the slit transmittance is different between the TE and TM polarizations, the image detected through the aperture will be different from the image that would have been created in photoresist without the aperture. This can lead to an accuracy problem in the measurement.

As discussed above the different polarizations TM and TE can have different transmittance properties through an aperture. FIG. 3B illustrates the relative transmittance of TE and TM polarized image light through the narrow aperture 320 of the detector aperture 300 of FIG. 3A. The plots are based upon a simulation (solving Maxwell's Equations using Finite Difference Time Domain (FDTD) method) where the conditions assumed are:

that the shielding material is Cr, where the optical properties are n=0.841, and k=1.647;

where the illumination light has a wavelength of $\lambda$=193 nm (e.g., ArF laser);

where the thickness of the shielding later is about 95 nm; and where the aperture is a slit and is varied from 15 nm to 235 nm.

As is illustrated in FIG. 3B the transmittance for the TE and TM modes are different for various slit widths, and match at a slit width of about 60 nm. However to determine features in the image light it is often useful to have a slit width smaller than 60 nmn, for example 45 nm. At 45 nm though the TM transmittance is higher than the TE transmittance. Notice that at 45 nm the transmittance level of both modes have decreased.

To illustrate reduced intensity due to diffractive effects on the transmitted image light, a detector is moved to two positions A1 and A2 (FIG. 3A) and the image light measured and plotted in FIGS. 3C and 3D respectively.

FIG. 3C illustrates the Poynting vector intensity as a function of spatial dimension at an observing position A1 for the simulation conditions. Position A1 is next to the aperture 320 while position A2 is offset 1.5 microns from the aperture exit. FIG. 3C illustrates the localized intensity about the Aperture Middle Line (AML) with no offset distance. However, often the detector can not be placed at the aperture exit. Instead the sensor of the detector is often set within the detector so that there is a resultant offset distance.

FIG. 3D illustrates the Poynting vector intensity as a function of spatial dimension at an observing position A2, at an offset distance of 1.5 microns from the aperture exit. FIG. 3D illustrates the dispersed and reduced nature of the intensity about the AML at an offset distance. Thus the diffractive nature of the aperture can result in decreased intensity at the detector and contrast reduction, and a lower signal to noise ratio (i.e., SN ratio).

Additionally variation in transmitted intensity, through a 1-D slit, between TE and TM can occur as the incident angle θ varies. FIG. 3E illustrates the angular and polarization dependence of transmittance as determined via simulation where (referring to FIG. 3A) the aperture 320 is a cross-section of a 1 D slit filled with SiO2; the aperture width d>=50 nm; the shield layer 310 is made of Tantalum with a thickness W1>=80 nm; the medium 310A is water; and the medium 310B is SiO2. As can be seen the TE and TM polarizations have different transmission properties. With the transmittance of both modes approach each other in value as the incidence angle increases. For accurate measurements, the transmittance between the TE and TM polarizations needs to be matched including their angular behaviors. One solution to this issue has been discussed in application 10025281US01 (100-3365) filed on Oct. 21, 2005, which discusses matching the transmittance of the TE and TM polarizations by properly adjusting the effective refractive index in an aperture space. By controlling the volume ratio between mediums (e.g., air and/or other materials) in the aperture (for example, the same material as substrate), the refractive index in the aperture space can be effectively controlled. In the discussed system to avoid intrusion of a liquid medium into the aperture space (e.g., if part of the medium in the aperture is air) a cover plate can be used. Additionally, with the discussed system, the fabrication method can be difficult to obtain a partially filled aperture.

In addition to diffraction's reduction of the detected image intensity, the various transmittances of the TE and TM mode can result in reduced accuracy in the measurement. For example FIG. 4A illustrates the image 420a from TE polarized image light 410a.

FIG. 4B illustrates the image 420b from TM polarized image light 410b. When the illumination beam is not polarized, the actual image is represented as a superposition (or as the average) of the two image components. Thus, when more TM mode light is transmitted through an aperture the detected image will be different from the image created on the wafer. Thus, conventional detector apertures can suffer from various levels of diffractive effects and accuracy issues.

SUMMARY OF THE INVENTION

At least one exemplary embodiment is directed to a detection aperture array that substantially matches the TE and TM polarizations by replacing a 1-D slit with a 1-D aperture array, improving the detected resolution and/or intensity of the sampled image.

At least one exemplary embodiment is directed to a detection aperture array that substantially matches the transmission properties between the TE and TM polarizations by using a 1-D aperture array which includes apertures of varying shape and size, improving the detected resolution and/or intensity of the sampled image.

At least one exemplary embodiment is directed to a detection aperture array that substantially matches the transmission properties between the TE and TM polarizations by using a 2-D aperture array, improving the detected resolution and/or intensity of the sampled image.

At least one exemplary embodiment is directed to a detection aperture array that substantially matches the transmission properties between the TE and TM polarizations by using a 2-D aperture array, wherein the 2-D aperture array includes at least two 1-D aperture arrays each slightly non aligned with respect to the other along the 1-D direction, improving the detected resolution and/or intensity of the sampled image.

At least one exemplary embodiment is directed to a detection aperture array that substantially matches the transmission properties between the TE and TM polarizations by varying the aperture index of refraction improving the detected resolution and/or intensity of the sampled image.

At least one exemplary embodiment is directed to methods of fabrication of aperture arrays of exemplary embodiments.

Further areas of applicability of exemplary embodiments of the present invention will become apparent from the detailed description provided hereinafter. It should be understood that the detailed description and specific examples, while indicating exemplary embodiments of the invention, are intended for purposes of illustration only and are not intended to limit the scope of the invention.

BRIEF DESCRIPTION OF THE DRAWINGS

Exemplary embodiments of present invention will become more fully understood from the detailed description and the accompanying drawings.

DETAILED DESCRIPTION OF EXEMPLARY EMBODIMENTS OF THE PRESENT INVENTION

Figure 1:
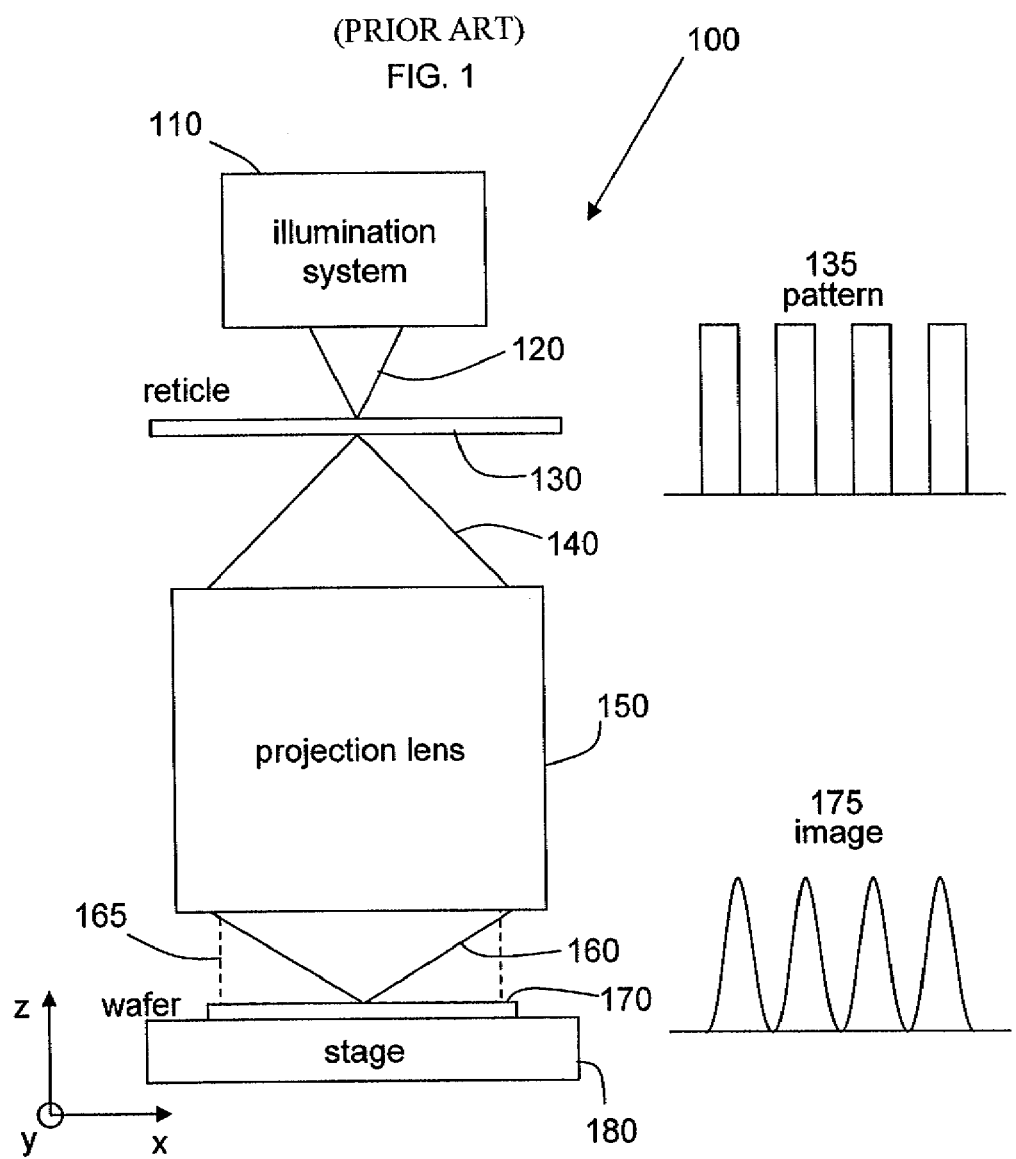
FIG. 1 illustrates a conventional exposure apparatus used for optical lithography.
Figure 2A:
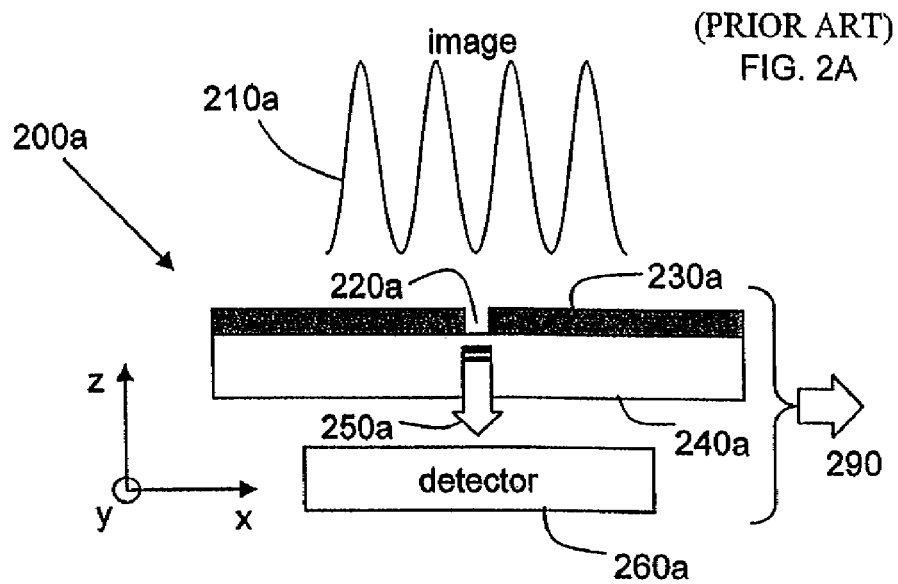
FIG. 2A illustrates a conventional one-slit image sampling detection arrangement sampling a periodic image intensity.
Figure 2B:
FIG. 2B illustrates a conventional one-slit image sampling detection arrangement sampling a non-periodic image intensity.
Figure 2C:
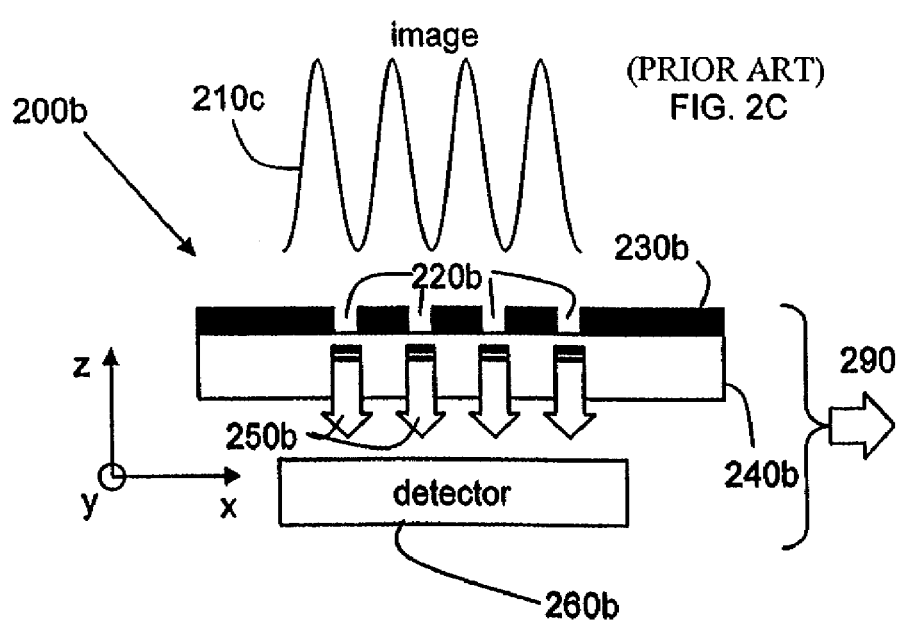
FIG. 2C illustrates a conventional multi slit image sampling detection arrangement sampling a periodic image intensity.

The following description of at least one exemplary embodiment is merely illustrative in nature and is in no way intended to limit the invention, its application, or uses.

Exemplary embodiments can be used with any image sampling or detection system and are not limited to those discussed in the illustrative examples herein.

Processes, techniques, apparatus, and materials as known by one of ordinary skill in the art may not be discussed in detail but are intended to be part of the enabling description where appropriate. For example semiconductor etching materials and procedures may not be discussed in detail (e.g., using positive or negative photoresists), however one of ordinary skill would be able, without undo experimentation, to use such materials and procedures, given the enabling disclosure herein, to construct detection aperture devices in accordance with exemplary embodiments. Such procedures and materials are intended to fall within the scope of exemplary embodiments.

Also note that exemplary embodiments can also be applied to any imaging apparatus that samples an image through an aperture, (e.g., a microscope) and thus, are not limited to the example uses described herein.

Notice that similar reference numerals and letters refer to similar items in the following figures, and thus once an item is defined in one figure, it may not be discussed or further defined in the following figures.

SUMMARY OF EXEMPLARY EMBODIMENTS

Two exemplary embodiments are discussed herein with associated examples and a method of fabrication. However these exemplary embodiments are not meant to be limitative of the number of exemplary embodiments but instead are included for illustrative purposes.

The first exemplary embodiment is directed to a 1-D detection aperture array, where in a first example of a first exemplary embodiment the pitch between the apertures in the aperture array are varied to improve the relative transmittance of TE and TM modes (i.e., substantially match) passing through the aperture array.

In a second example of a first exemplary embodiment, the thickness of the refractive material in the apertures of the aperture array is varied to improve the relative transmittance of TE and TM modes passing through the aperture array.

Additional examples of the first exemplary embodiment matches the transmission properties between the TE and TM polarizations by using a 1-D aperture array which includes apertures of varying shape and size, improving the detected resolution and/or intensity of the sampled image.

A first example of the second exemplary embodiment is directed to a detection aperture array that substantially matches the transmission properties between the TE and TM polarizations by using a 2-D aperture array where the apertures refractive material's thickness can be varied, improving the detected resolution and/or intensity of the sampled image.

A second example of the second exemplary embodiment is directed to a detection aperture array that substantially matches the transmission properties between the TE and TM polarizations by varying the pitch between apertures in a 2-D aperture array.

Additional examples of the second exemplary embodiment is directed to a detection aperture array that matches the transmission properties between the TE and TM polarizations by using a 2-D aperture array, wherein the 2-D aperture array includes at least two 1-D aperture arrays each slightly non aligned with respect to the other along the 1-D direction, improving the detected resolution and/or intensity of the sampled image.

First Exemplary Embodiment

The first exemplary embodiment is directed to a detection 1-D aperture array that can include apertures of varying shape and size, apertures with varying thickness of aperture material, and varying pitch between apertures, improving the detected resolution and/or intensity of the sampled image.

The first example of the first exemplary embodiment substantially matches the transmittance between the TE and TM polarizations, by properly adjusting the aperture refractive index, in each aperture of an aperture array, between 1 (e.g., air or vacuum) and that of a substrate (e.g., SiO2, n=1.56). FIGS. 6A, 6B, 7A, 7B, 8A-8C, 13A, and 13C illustrate several non-limiting examples in accordance with the first exemplary embodiment. To adjust the aperture effective refractive index, a material can be added in each aperture of a plurality of apertures, for example SiO2, MgF2, LiF, and other materials to adjust the index of refraction as known by one of ordinary skill in the relevant art and equivalents.

Figure 5A:
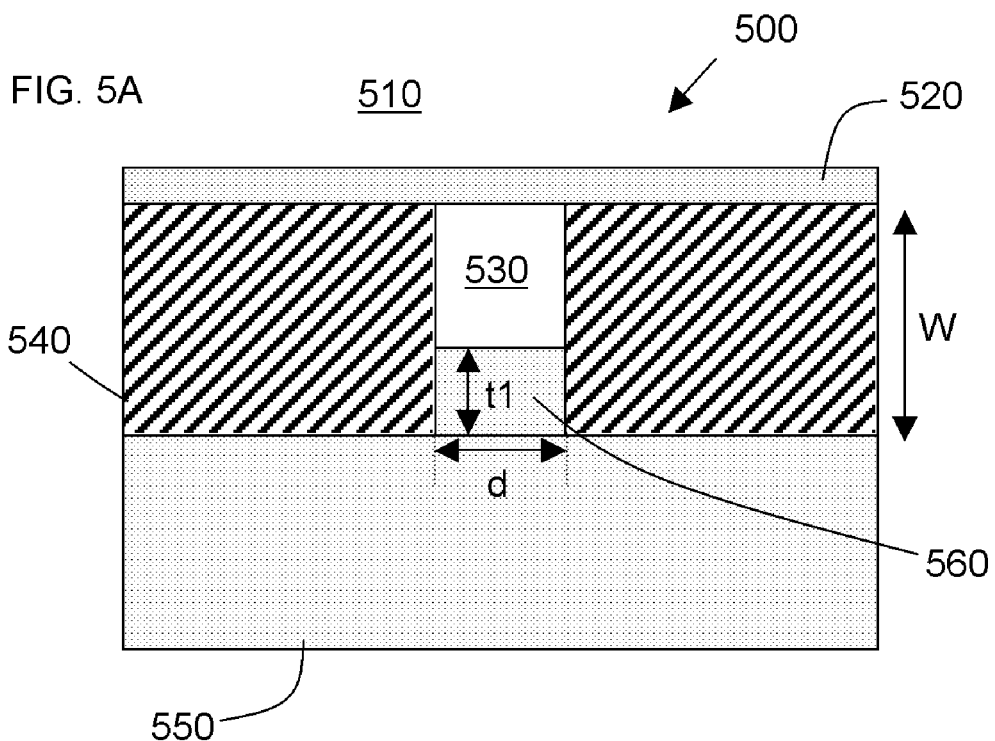
FIG. 5A illustrates an example of a detection aperture that changes the refractive index of an aperture by partially filling the aperture with material.
Figure 5B:
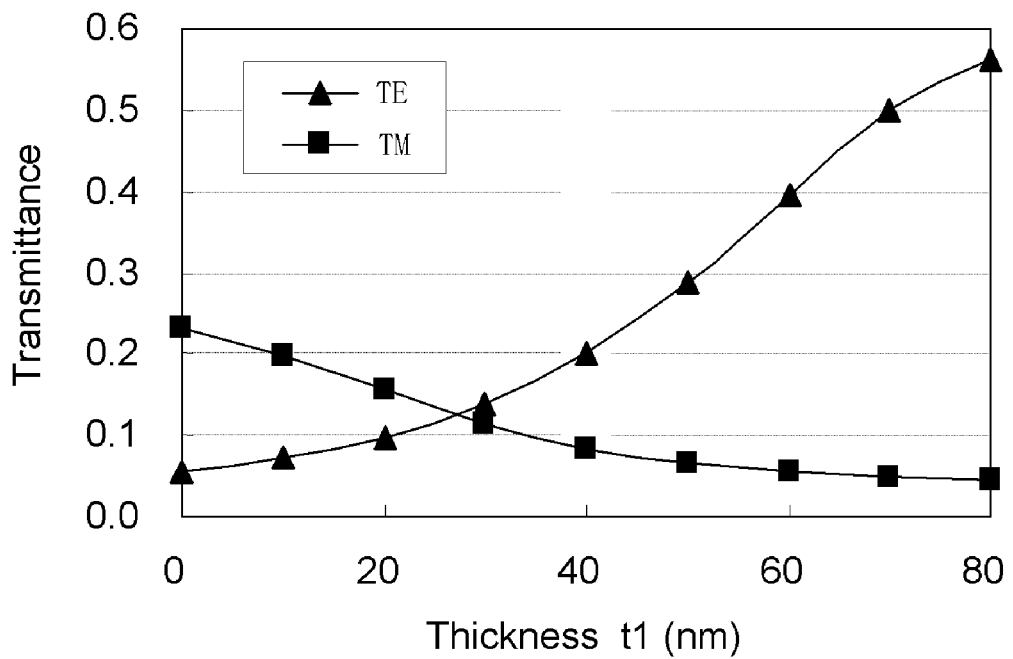
FIG. 5B illustrates the relative transmittance of TE and TM polarized image light through the detection aperture of the example illustrated in FIG. 5A.

An example of a slit detection aperture 500, is illustrated in FIG. 5A. Aspects of the slit detection aperture (e.g., shield layer material, second aperture material) can also be used in exemplary embodiments and features of FIGS. 5A and 5B are used as illustrative examples of general arrangements and materials, where the first and second exemplary embodiments are directed to aperture arrays, where the apertures can be of various shapes. In FIG. 5A, a shield layer 540 has an aperture with a first aperture material 530 and a second aperture material 560 inserted. The aperture is one of a plurality of non-slit apertures extending into and out of the paper. The second aperture material has a thickness of "t1" and a width of "d." The shield layer 540 can be covered by a cover layer 520 (e.g., SiO2) that is substantially transparent to the wavelength of the image light and can hold in the aperture materials or prevent other materials from entering the aperture. Note that in general the aperture can be filled completely with the second aperture material, and thus a cover layer 520 may not be included. The cover layer 520 is exposed on the opposite side to the aperture to an adjacent medium 510 that can vary depending upon the device or its usage (e.g., purified water, air, vacuum), and the shield layer 540 can be supported by a support layer 550 that is operatively connected to the shield layer 540 on the side opposite the cover layer 520. Setting the aperture size (e.g., each individual aperture's size) to a desired value and varying the thickness t1 can result in varying the transmittance of TE and TM modes through the aperture array.

Although the first and second exemplary embodiments are generally directed to an array of apertures, for illustrative purposes FIG. 5B illustrates the relative transmittance of TE and TM polarized image light through a detection aperture where the aperture is a single slit with the simulation conditions of:

for an adjacent medium 510 of water (n=1.44, k=0);

where the light shield layer 540 is made of Cr, with a thickness (W) of 80 nm, where 80 nm has been chosen so that the transmittance of light through the shield layer is less than 0.001;

where support layer 550 is SiO2 (n=1.56, k=0);

where the cover layer 520 is also SiO2, and prohibits water from the adjacent medium 510 from entering the aperture;

the aperture is a slit with a width (d) of 45 nm, where the theoretical image resolution is 22.5 nm; and where the thickness (t1) is varied from 0 to 80 nm, where the material for the second aperture medium 560 is SiO2 and the material of the first aperture medium 530 is air. Note that these values are for illustrative purposes only and other various dimensional values and materials can be used within the scope of the exemplary embodiments.

FIG. 5B illustrates the simulation results. A thickness (t1) value of 80 nm symbolizes that the aperture is completely filled with the second aperture medium. Notice in this case that the TE mode's transmittance is higher than the TM mode's transmittance for certain thicknesses t1. Additionally note that with a thickness (t1) of about 28 nm the transmittance of the TE and TM modes is substantially equal. Thus, varying the thickness (t1) varies the relative transmittance and similar procedures can be used to substantially match the transmittance of the TE and TM modes through the aperture to the detector or to emphasize particular modes. Changing the thickness t1 is equivalent to changing the effective refractive index within the aperture between the refractive index of air (when t1=0) and the refractive index of SiO2 (when t1=80 nm). To fabricate a detector aperture in accordance with the first exemplary embodiment, processes and techniques involved in semiconductor etching can be used.

Figure 3A:
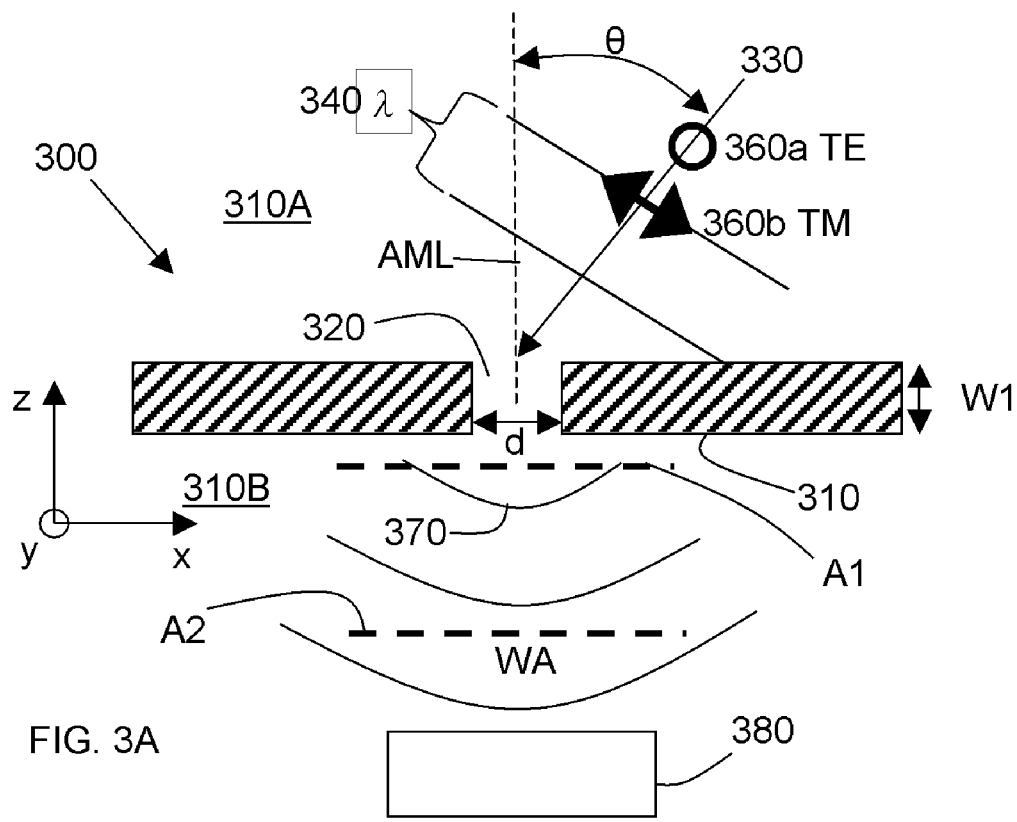
FIG. 3A illustrates the diffraction of image light through a narrow slit aperture.
Figure 3B:
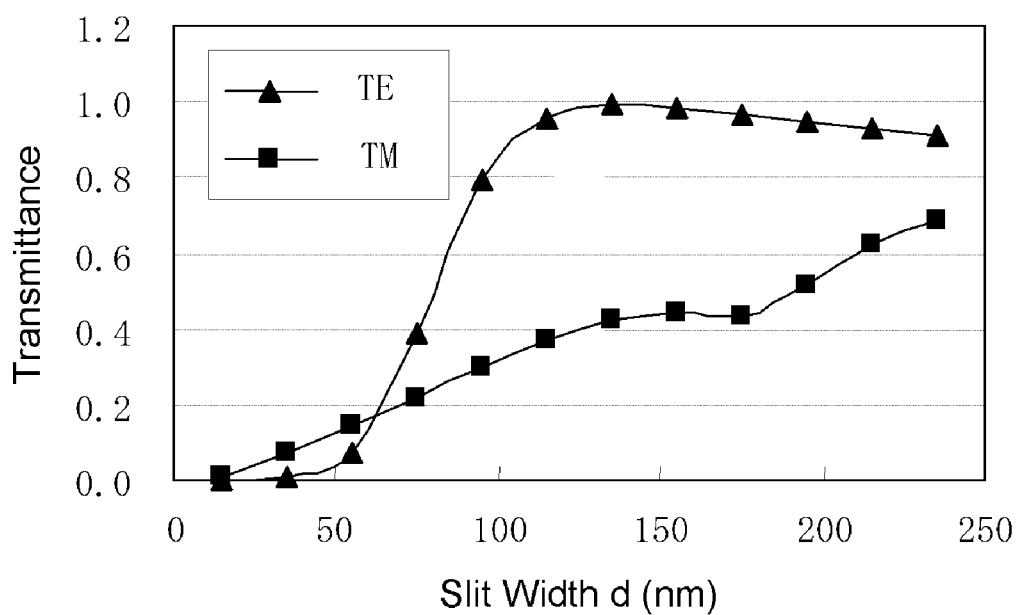
FIG. 3B illustrates the relative transmittance of TE and TM polarized image light through the narrow slit aperture illustrated in FIG. 3A.
Figure 3C:
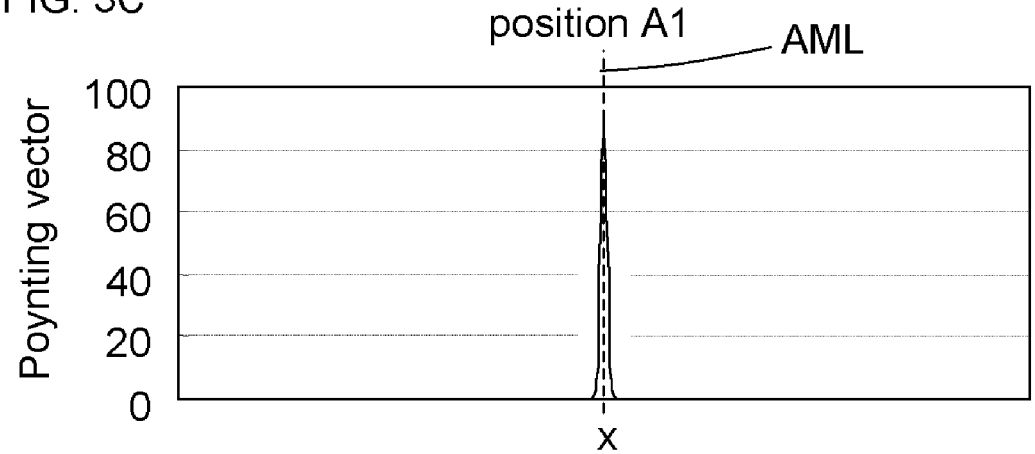
FIG. 3C illustrates the Poynting vector intensity, passing through the narrow slit aperture illustrated in FIG. 3A, as a function of spatial dimension at an observing position A1.
Figure 3D:
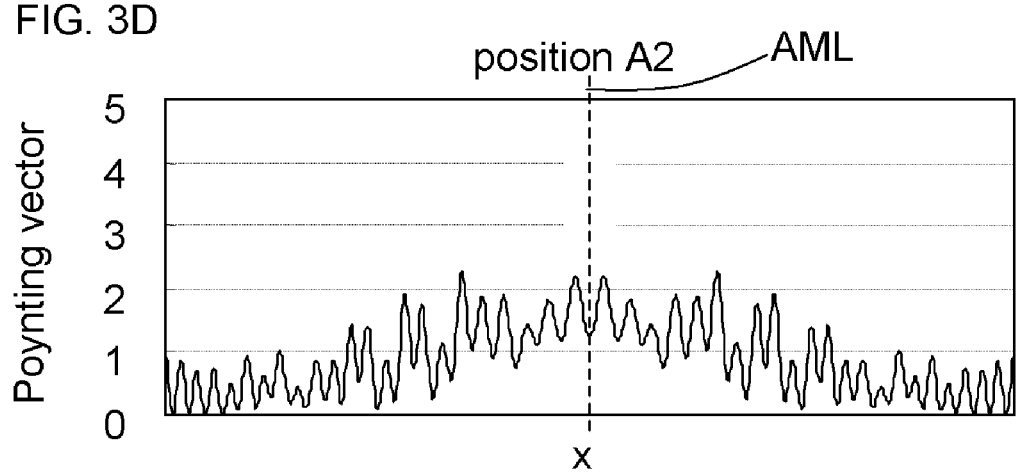
FIG. 3D illustrates the Poynting vector intensity, passing through the narrow slit aperture illustrated in FIG. 3A, as a function of spatial dimension at an observing position A2.
Figure 3E:
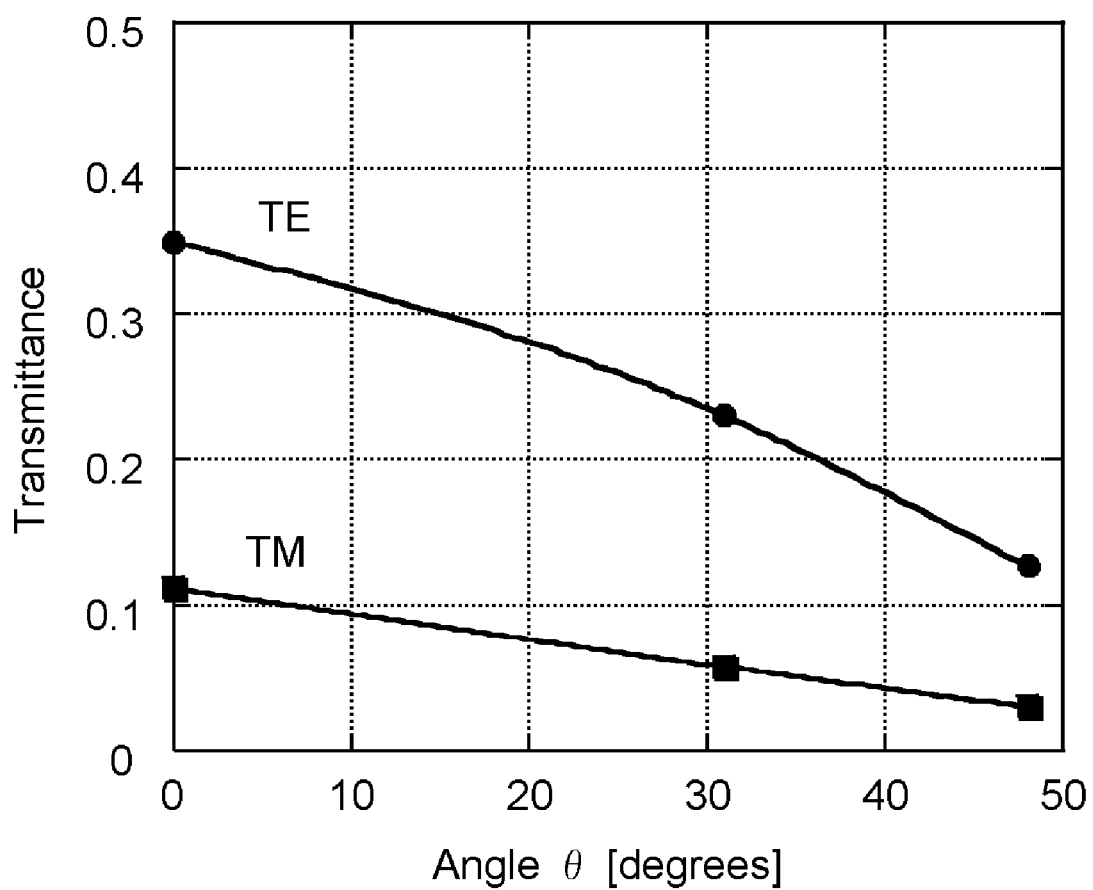
FIG. 3E illustrates the relative transmittance of TE and TM polarized image light through the narrow slit aperture as a function of angle of incidence of the initial image light.
Figure 4A:
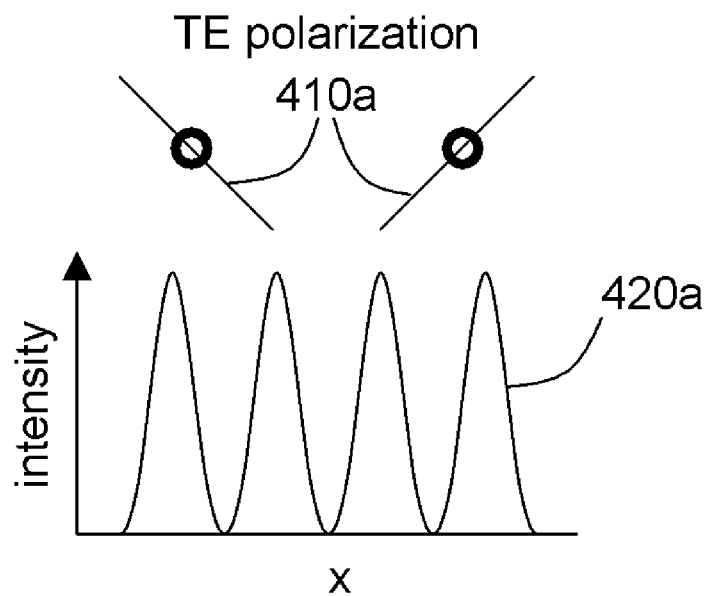
FIG. 4A illustrates the image contrast of TE polarized image light.
Figure 4B:
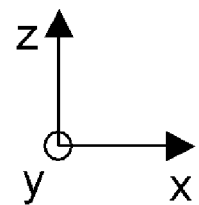
FIG. 4B illustrates the image contrast of TM polarized image light.
Figure 4B:
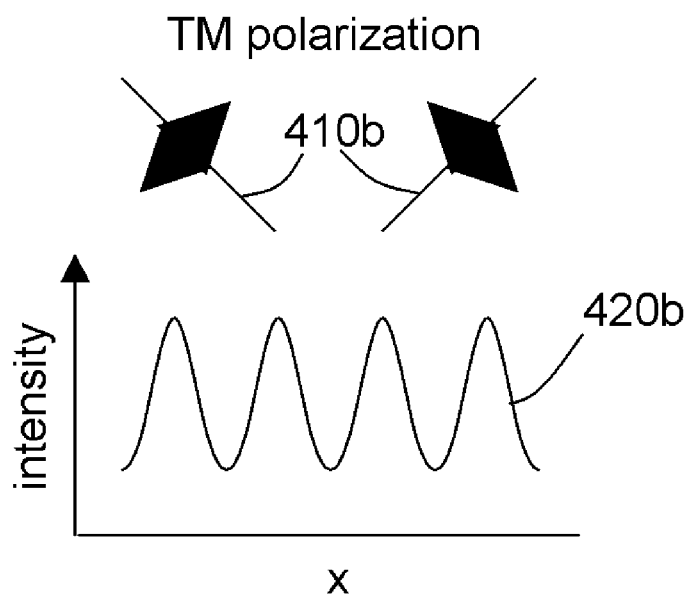
Figure 6A:
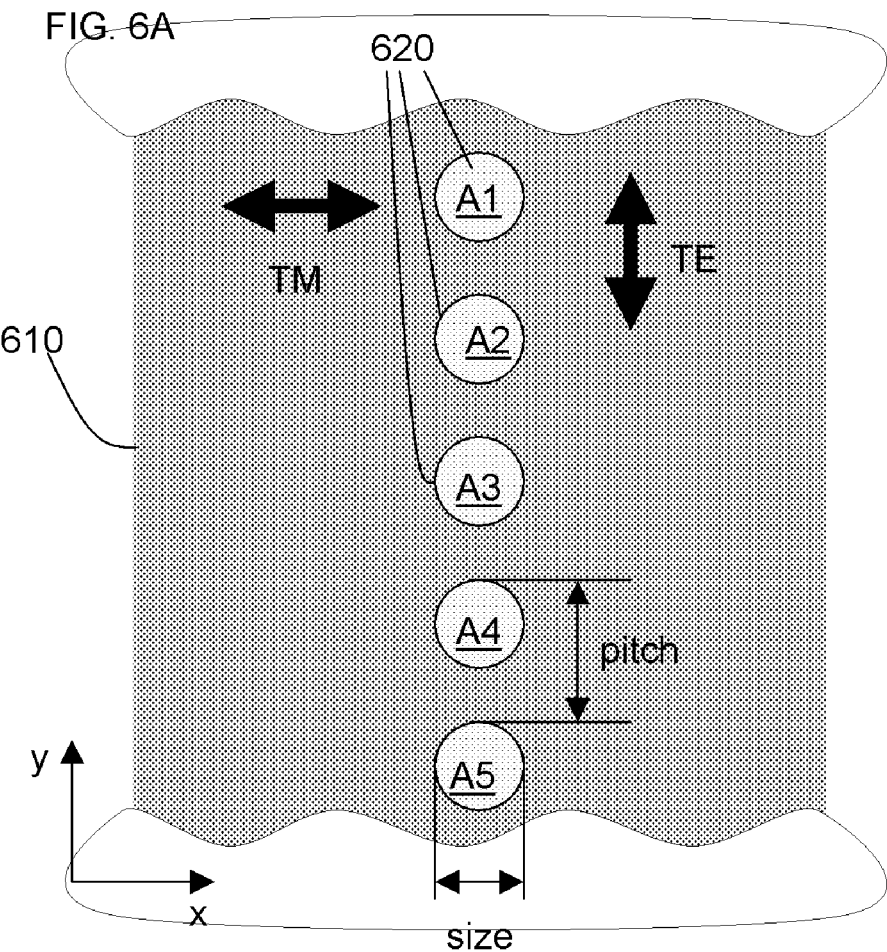
FIG. 6A illustrates a first example of an aperture array in accordance with at least one exemplary embodiment.

Thus likewise in the case of the first example of the first exemplary embodiment, the apertures (e.g., recesses in the shield layer 540) can be completely filled with a material having a thickness t1 equal to the shield layer 540 width W. Additionally instead of a slit as in the illustrative example of FIG. 5A, the first example of the first exemplary embodiment and the first example of the second exemplary embodiment are directed to a plurality of individual apertures that can be arranged in a 1-D or 2-D array in the shield layer 540 with varying refractive thicknesses as illustrated in FIGS. 5A-5B, for example FIG. 3E and FIGS. 6C-6D are simulated using circular apertures (see FIGS. 6A-6B) in an aperture array.

The second example of an aperture array in accordance with the first exemplary embodiment substantially matches the transmittance between the TE and TM polarizations by properly controlling the pitch of the 1-D aperture array, likewise in the second example of the second exemplary embodiment (2-D aperture array) the pitch between apertures can be controlled. FIG. 6A illustrates a second example of an aperture array (also referred to as a detection aperture array) in accordance with the first exemplary embodiment. As illustrated instead of using a 1-dimensional slit, the first exemplary embodiment is directed to a 1-D array 620 of a plurality of apertures (A1-A5) formed in a shield layer 610. A bird's eye view of the same structure is presented in FIG. 6B. The aperture array 620 is represented by the size of each aperture in the aperture array and the pitch between adjacent apertures. The array 620 is assumed to lie along the y direction, although the array can be non-linear as well (e.g., S-shaped). The terminologies TE/TM polarizations are used in the same manner as the case of a simple aperture slit as discussed with respect to FIG. 5B. In the particular example illustrated the TE mode is arranged substantially parallel with the y-axis, while the TM mode is arranged substantially parallel with the x-axis, although exemplary embodiments are not so limited.

Figure 6B:
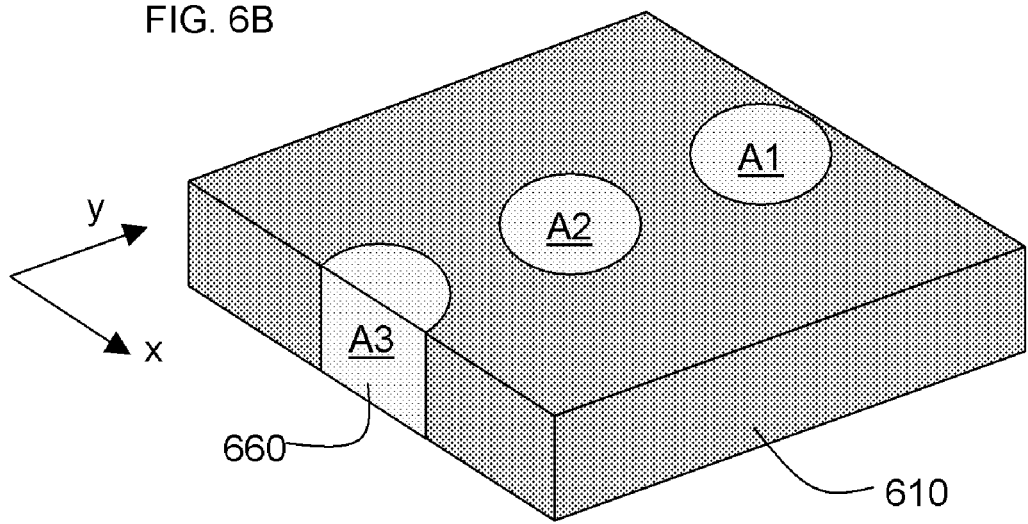
FIG. 6B illustrates an isometric view of the aperture array illustrated in FIG. 6A.

FIG. 6B illustrates an isometric view of the aperture array illustrated in FIG. 6A. The particular example illustrates the apertures (A1-A3) which are formed by recesses in the shield layer 610 filled with a medium 660. In the second example of the first exemplary embodiment the transmittance of the TE and TM polarizations are substantially matched by increasing the pitch to over 100 nm (see FIG. 6C). In addition, the transmittance (of the both polarizations) can be increased by filling the apertures with materials having high refractive index (e.g., FIG. 11). In the first example of the first exemplary embodiment the TM and TE transmittance is substantially matched by varying the thickness of the refractive material in each aperture, in the second example the pitch between apertures is controlled. Additionally both of these features (i.e., of the first and second examples) can be combined in both 1-D (first exemplary embodiment) and 2-D (second exemplary embodiment) apertures arrays.

Figure 6C:
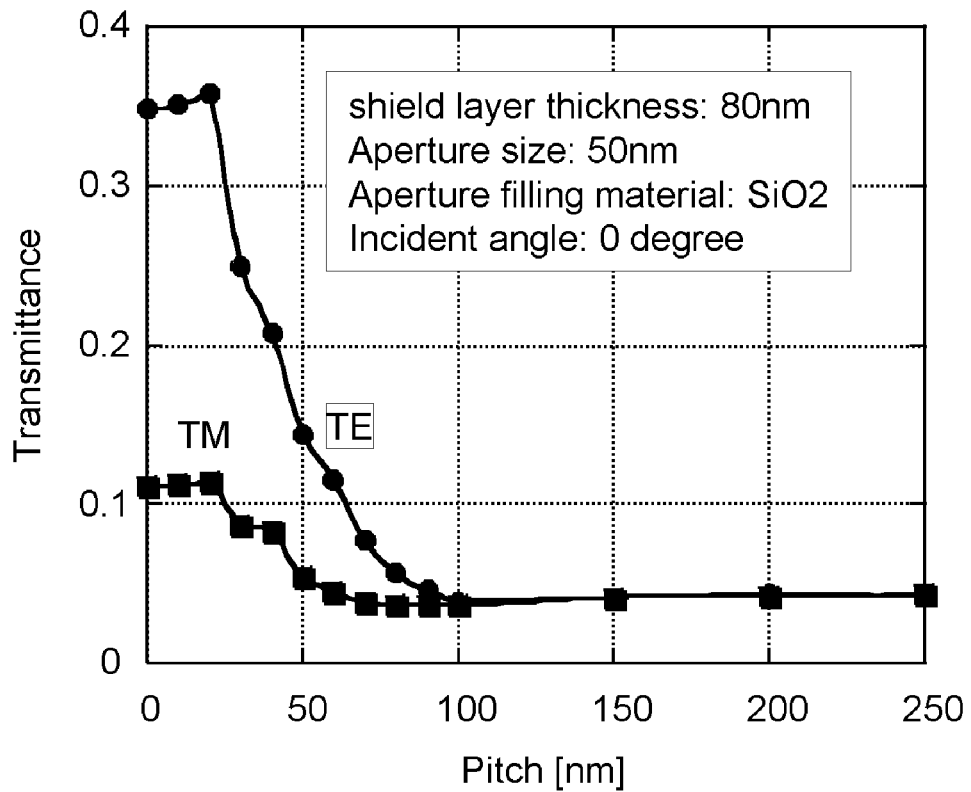
FIG. 6C illustrates the relative transmittance of TE and TM polarized image light through the aperture array illustrated in FIG. 6A as a function of the pitch between apertures.
Figure 6D:
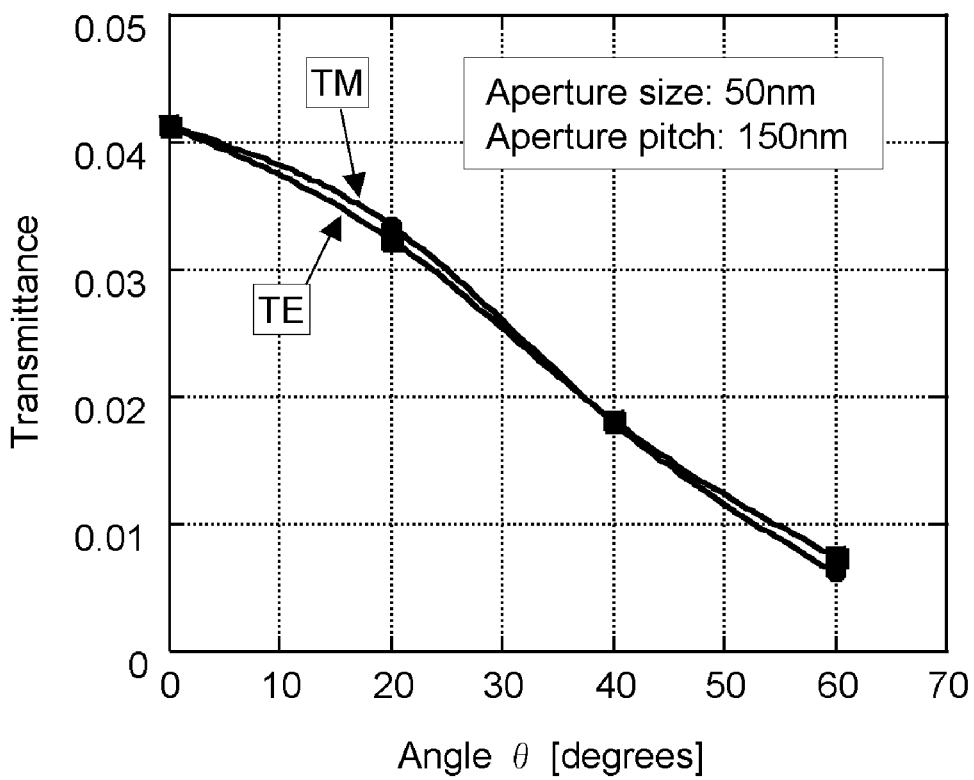
FIG. 6D illustrates the relative transmittance of TE and TM polarized image light through the aperture array illustrated in FIG. 6A as a function of the incident angle of the image light.

FIG. 6C illustrates the relative transmittance of TE and TM polarized image light through the aperture array illustrated in FIG. 6A as a function of the pitch between apertures. FIG. 6C illustrates that the transmittance is a function of the aperture pitch for both the TE and TM polarizations. The system configuration assumed for the calculation of the values in FIG. 6C are the same as described with respect to the calculation of FIG. 3E, as determined via simulation where (referring to FIG. 3A) the aperture 320 is a cross-section of a circular aperture filled with SiO2; the aperture width d>=50 nm; the shield layer 310 is made of Tantalum with a thickness W1>=80 nm; the medium 310A is water; and the medium 310B is SiO2. The case of pitch=0 nm corresponds to a simple slit aperture. The transmittances of TE and TM at pitch=0 shown FIG. 6C matches the values shown in FIG. 3E at the angle 0 for the TE and TM, respectively. As illustrated in FIG. 6C the polarization dependence of transmittance is diminished as the pitch is increased, and the polarization dependence disappears at the aperture pitch generally greater than about 100 nm. When the aperture pitch is less than 100 nm, the TE and TM polarizations show different transmittance in this example. In such a case, the TE and TM transmittance can be matched by adjusting the thickness of the aperture filling material SiO2, as explained using FIGS. 5A and 5B. At the pitch of 50 nm, for example, the expected transmittance for the TE and TM polarizations after the thickness adjustment is about 0.1, which is higher than the transmittance obtained with the aperture pitch larger than 100 nm.

FIG. 6D illustrates the relative transmittance of TE and TM polarized image light through the aperture array illustrated in FIG. 6A as a function of the incident angle of the image light. As illustrated there is substantial matching of the intensity of the TM and TE polarizations as a function of image light incident angle (theta) as compared to the values illustrated in FIG. 3E, for the simulation aperture size of 50 nm and aperture pitch of 150 nm.

Figure 7A:
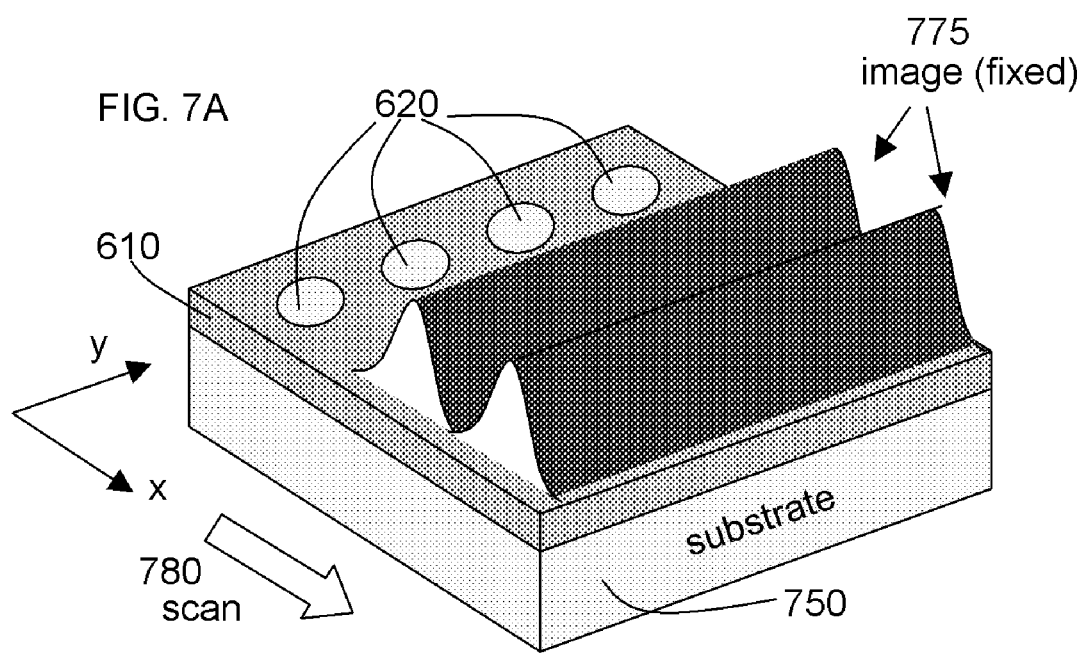
FIG. 7A illustrates an isometric view of the relative configuration between the aperture array in accordance with at least one exemplary embodiment and an image.

FIG. 7A illustrates an isometric view of the relative configuration between the aperture array in accordance with at least one exemplary embodiment and an image. The aperture array 620 is moved along with the shield layer 610 and supportive substrate 750 in a scan direction 780. An image 775 illuminates a region through which the aperture array passes.

Figure 7B:
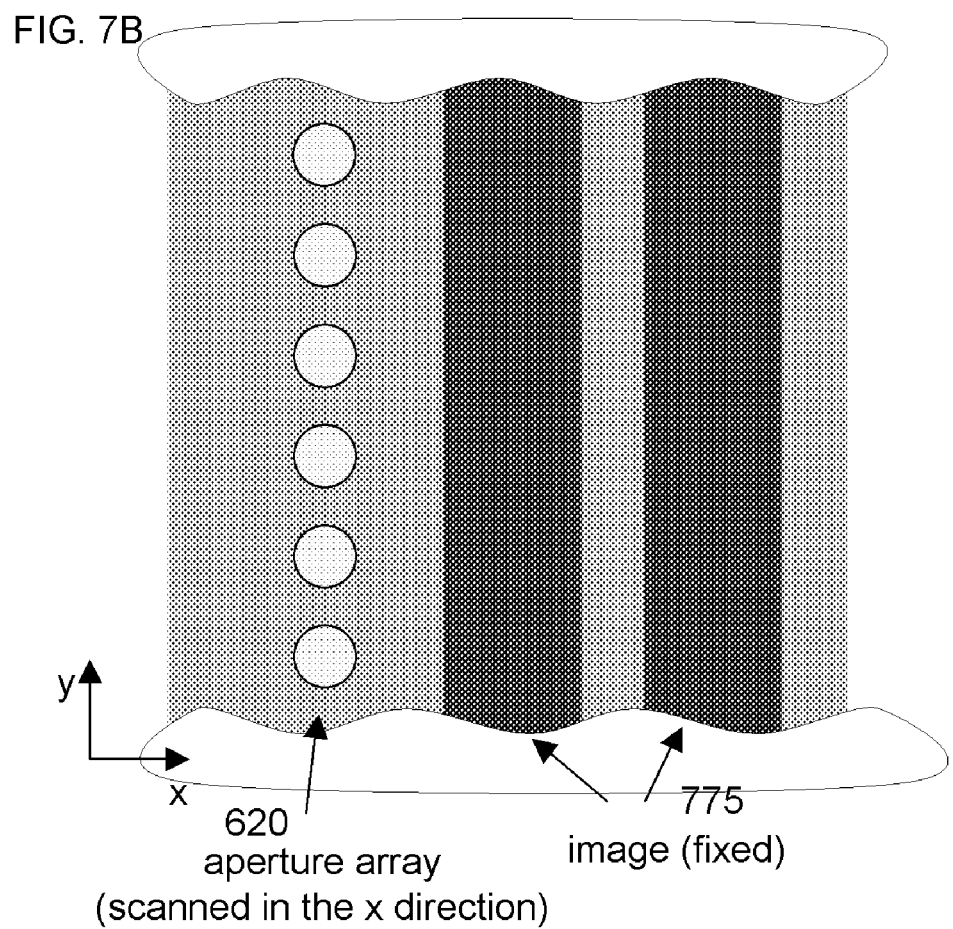
FIG. 7B illustrates the top view of the relative configuration illustrated in FIG. 7A.

FIG. 7B illustrates the top view of the relative configuration illustrated in FIG. 7A.

Figure 8A:
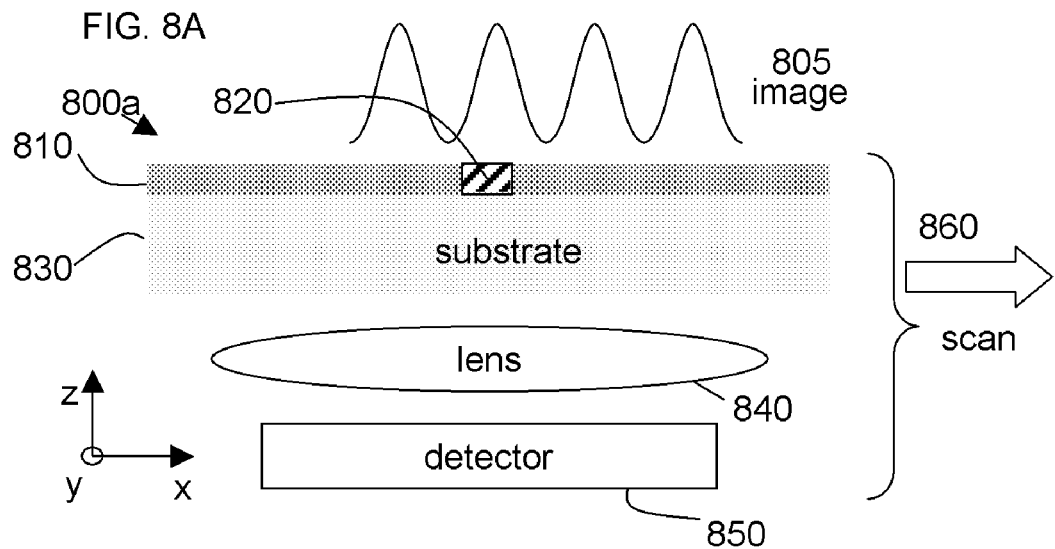
FIGS. 8A-8C illustrate various cross sections of measuring systems in accordance with at least one exemplary embodiment.
Figure 8B:
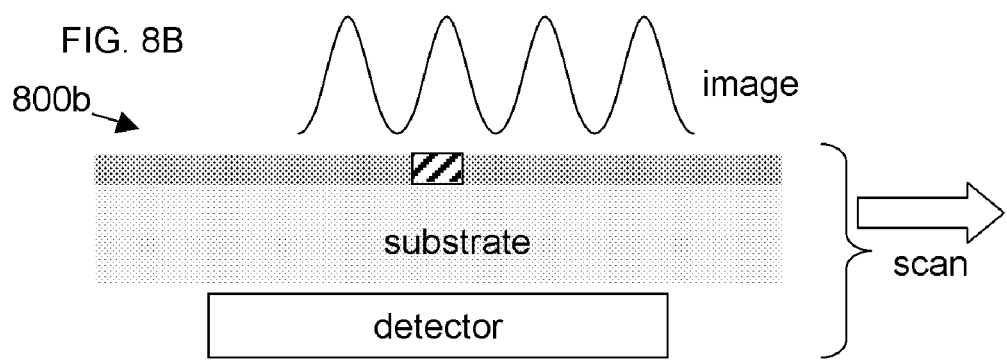
Figure 8C:
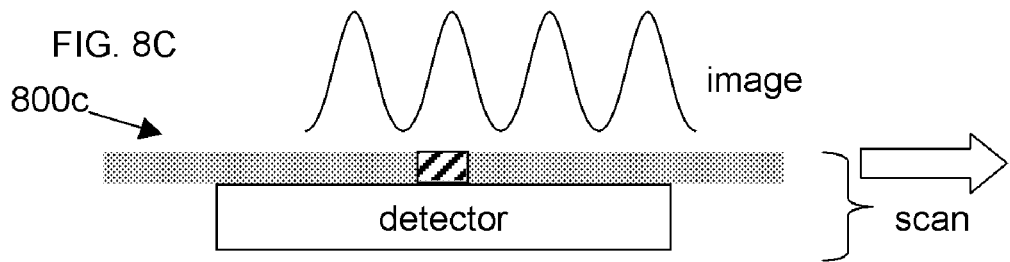

FIGS. 8A-8C illustrate various cross sections of measuring systems 800a-c in accordance with at least one exemplary embodiment. The shield layer 810 includes an array of apertures of which a cross section of one aperture 820 is illustrated. The shield layer 810 can be further supported by a supportive substrate 830 (FIGS. 8A and 8B). In the first example of a measuring system (800a) an optical system 840 (e.g., lens) directs the transmitted light to a detector 850. In a second example a measuring system (800b) a detector is positioned near the supportive substrate to detect the transmitted light. A third example (800c) positions the detector directly behind the shield layer 810.

Figure 9:
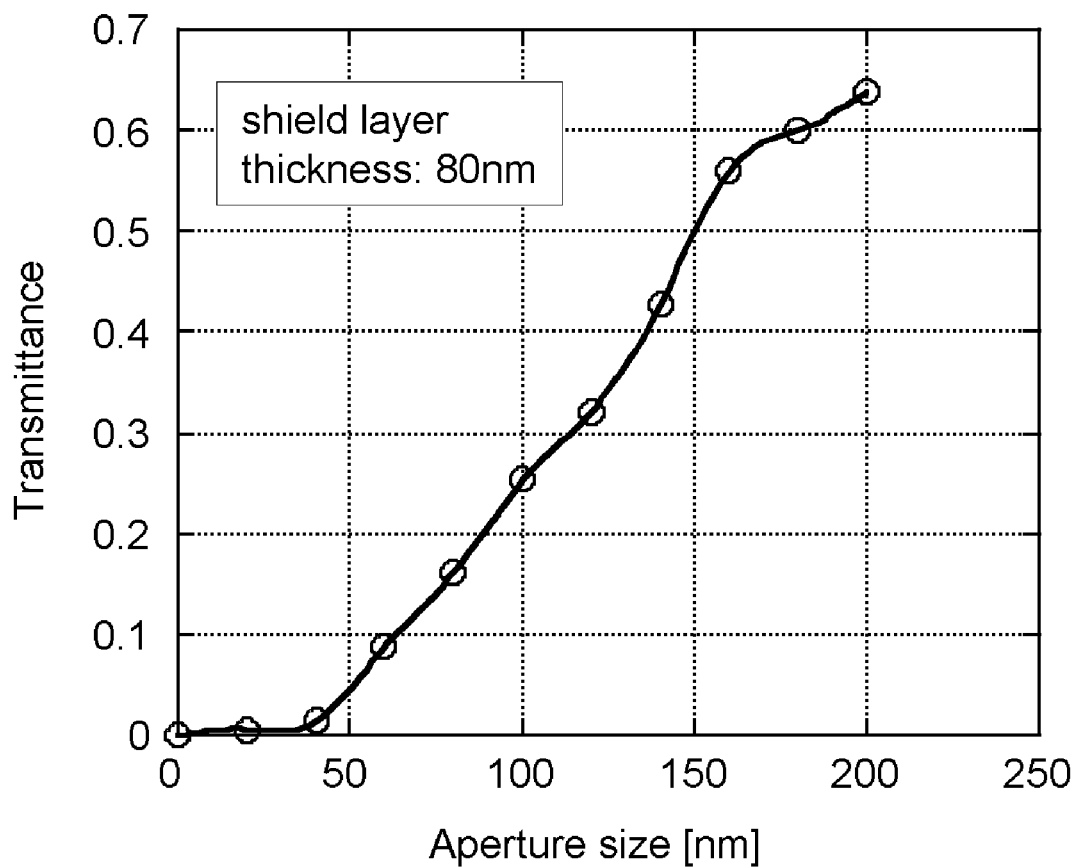
FIG. 9 illustrates the relation between total transmittance and aperture size.
Figure 10:
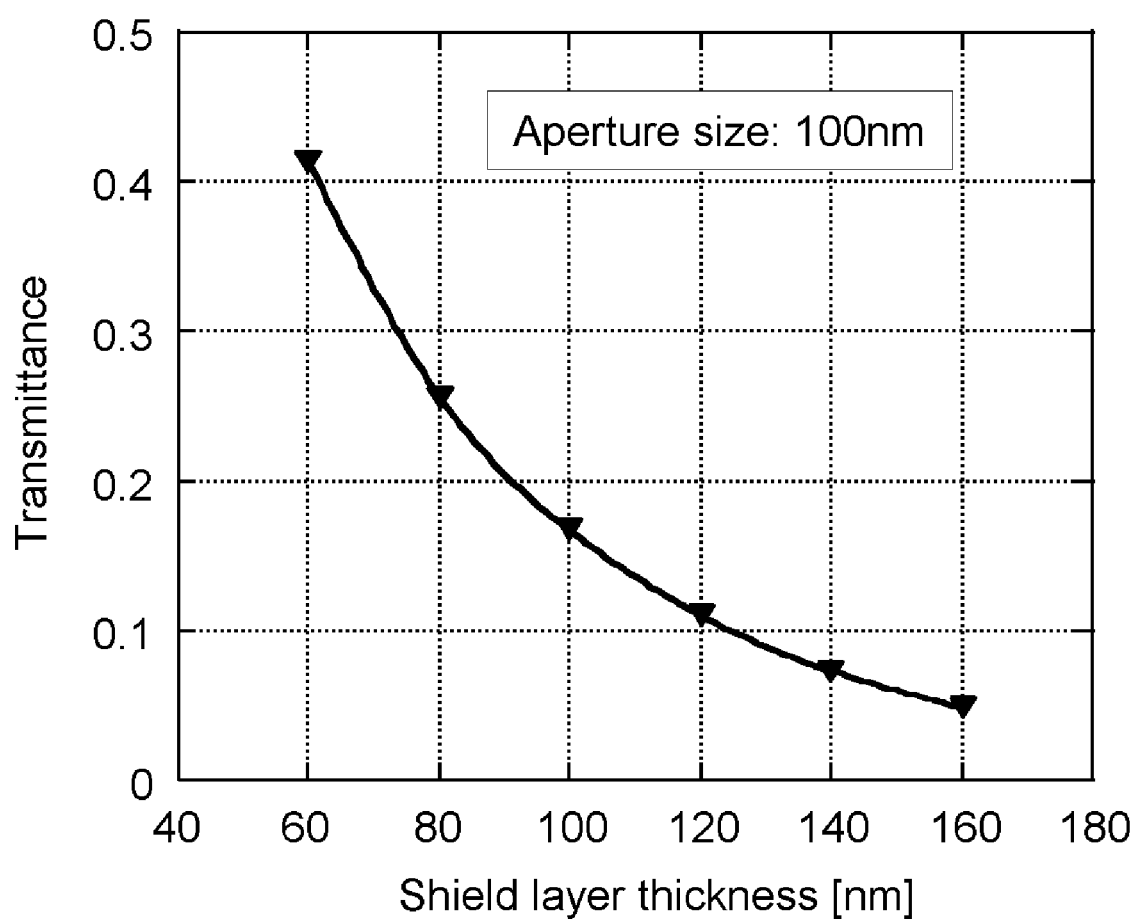
FIG. 10 illustrates the relation between total transmittance and shield layer thickness.

FIG. 9 illustrates the relation between total transmittance and aperture size. Although a larger aperture shows high transmittance, the resolution will be poor when applied for aerial image measurement. Thus, there is a trade-off relationship between the aperture transmittance and the resolution. Therefore, one method is to determine the aperture size considering a target image size for the measurement. In the example illustrated in FIG. 9 calculations assumed a shield layer thickness of 80 nm FIG. 10 illustrates the relation between total transmittance and shield layer thickness. The transmittance from an aperture becomes larger when a shield layer (also referred to as a light-shielding layer) becomes thinner. However, in that case, the performance as a shield layer is degraded. A portion of light impinging on a shield layer penetrates the layer, creating noises in measurement signals. One method is to determine the thickness of a shield layer by considering its light shielding performance.

Figure 11:
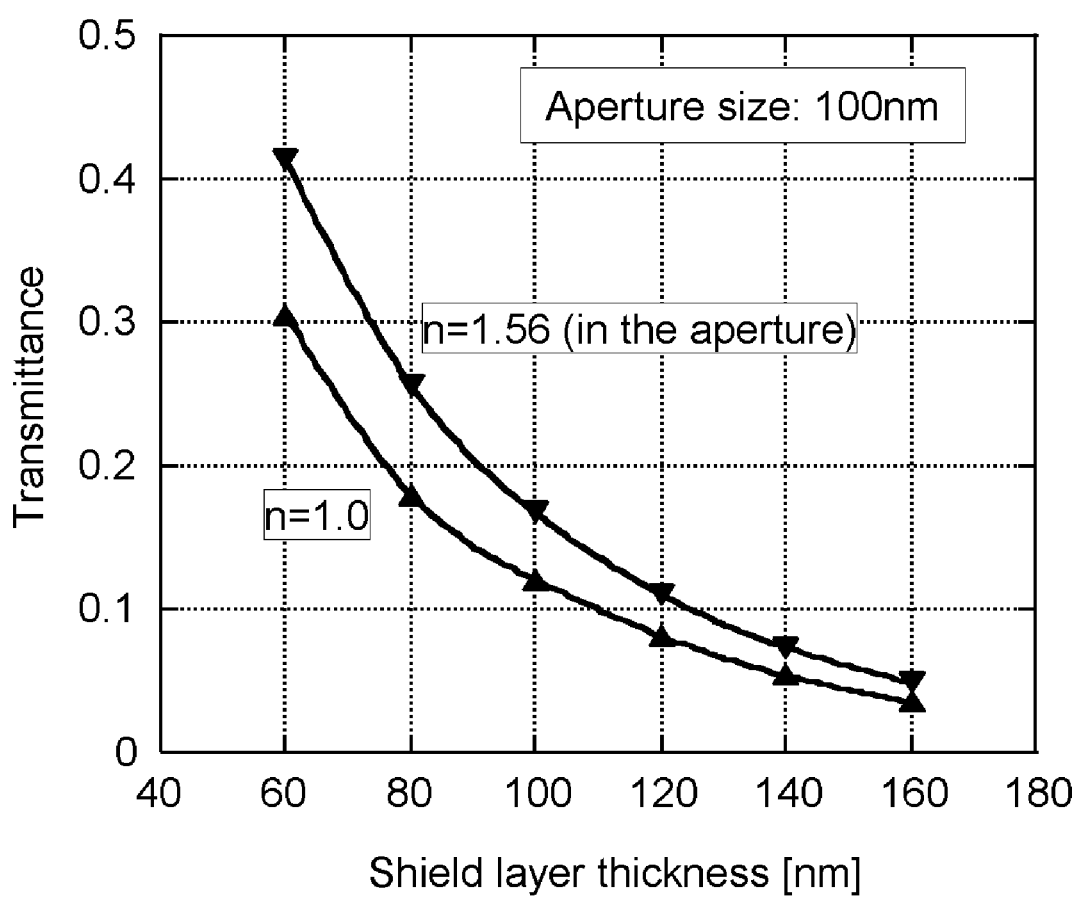
FIG. 11 illustrates the relation between total transmittance and shield layer thickness as a function of index of refraction of the material in an aperture.

FIG. 11 illustrates the relation between total transmittance and shield layer thickness as a function of index of refraction of the material in an aperture. One way to improve transmittance is to fill the aperture space with a material that has high refractive index. FIG. 11 shows a comparison between the cases of n=1.56 and n=1.0. The graph of n=1.56 is the same as FIG. 10. Note that further improvement of transmittance can be expected by filling the aperture space with AlN (aluminum nitride) whose refractive index is 2.423 at the wavelength of 193 nm.

The amount of light that reaches the detector can be controlled by the number of apertures in an array. The light intensity is proportional to the aperture number, and the aperture number is determined so that the total light intensity surpasses the minimum intensity that is required by the sensitivity of a detector.

When an image is periodic, multiple arrays that are allocated with the same or the integral multiple period as that of the image can be used to enhance the amount of light reaching the detector.

Second Exemplary Embodiment

A first example of the second exemplary embodiment is directed to a detection aperture which includes a 2-D aperture array that can have variable thickness effective refractive index aperture material, while a second example of the second exemplary embodiment is directed to varying the pitch between at least a few of the apertures in the 2-D aperture array, while a third example includes a 2-D aperture array which includes at least two 1-D aperture arrays each slightly non aligned with respect to the other along the 1-D direction, improving the detected resolution and/or intensity of the sampled image and a third example includes a 2-D aperture array where the aperture material can be varied in refractive index and thickness to improve the matching TE and TM. Note that in the first and second exemplary embodiments the aperture sizes and shapes can vary.

As discussed above with respect to the first exemplary embodiment, further exemplary embodiments are not limited to a detection aperture array having only one dimension.

Figure 12A:
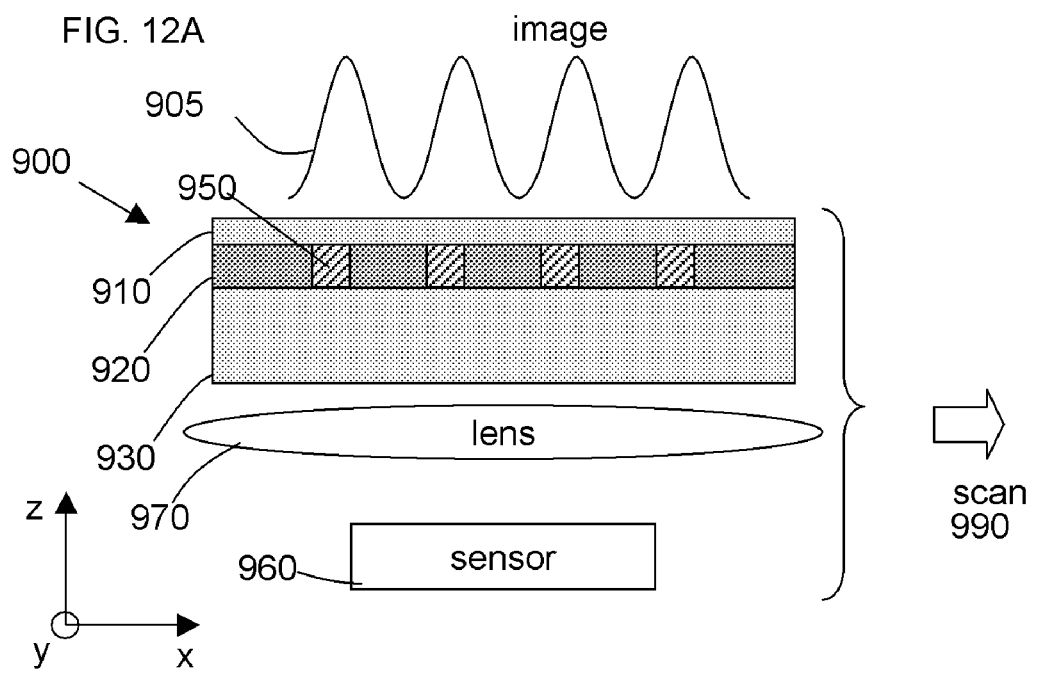
FIG. 12A illustrates a cross section of a multi-linear aperture array measuring system.

Multiple dimensional aperture arrays are intended to lie within the scope of the exemplary embodiments. FIG. 12A illustrates an example of a detection aperture 900 in accordance with at least one exemplary embodiment. An image 905 carried by image light is incident on a cover layer 910 (optional, e.g., SiO2), which covers a shield layer 920. The shield layer 920 contains a plurality of apertures 950, which can be filled with material, either fully or partially in accordance with at least one exemplary embodiment. The shield layer can rest on a support layer 930 through which the light passing through the apertures 950 can pass. The light can be collimated by a lens 970, and to a sensor 960 of a detector. The entire detector aperture 900 can be moved 990 in a scanning direction.

In summary, a detector aperture in accordance with the second exemplary embodiment is similar to the first exemplary embodiment, which can include a shield layer and an aperture array, where the aperture array is placed in the shield layer, where the second exemplary embodiment includes a 2-D aperture array which can include at least one of varying thickness aperture material, a pitch between apertures, and offset 1-D arrays comprising the 2-D array.

Further detector apertures in accordance with the second exemplary embodiment can include a cover layer, and a support layer. In at least one exemplary embodiment the cover layer can have one side exposed to a fluid medium (e.g., air, water) or vacuum.

Figure 12B:
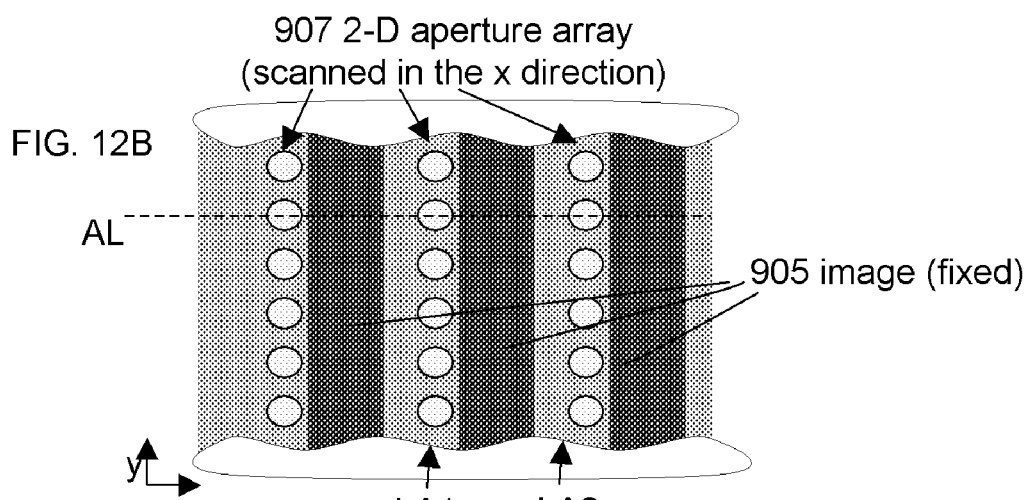
FIG. 12B illustrates a top view of the relative configuration between the multi-linear aperture array measuring system and a periodic image, where the apertures in neighboring linear aperture arrays are aligned.
Figure 12C:
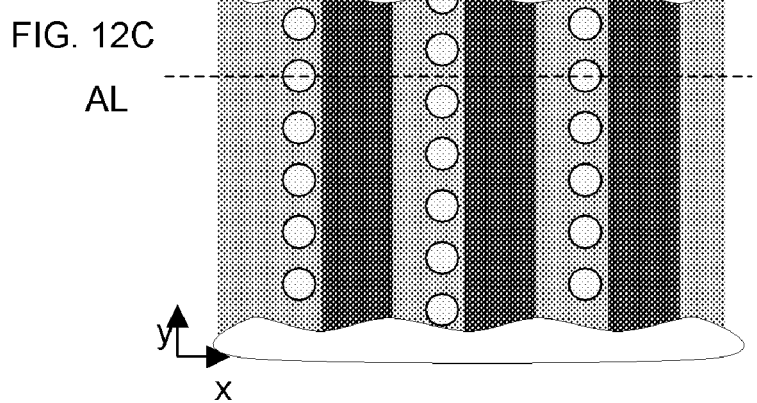
FIG. 12C illustrates a top view of the relative configuration between the multi-linear aperture array measuring system and a periodic image, where the apertures in neighboring linear aperture arrays are not aligned.

FIGS. 12B and 12C illustrate top views of two examples of a 2-D aperture array in accordance with the second exemplary embodiment. An alignment line AL passes through the center of an aperture in a second linear aperture array LA2. In the first example (FIG. 12B) AL passes through the center of a neighboring aperture in first linear array LA1, aligning the two linear aperture arrays LA1 and LA2. In the second example (FIG. 12C) AL does not pass through the center of a neighboring aperture in the LA1, thus in this example LA1 and LA2 are offset or non-aligned. Likewise if an error in fabrication misaligns neighboring linear arrays, over an extent the errors can even out if the error is both positive and negative with respect to the desired alignment. Additionally if the shape of apertures are various due to manufacturing errors the offset arrangement illustrated in FIG. 12C can average out the effects of the various shapes.

Figure 13A:
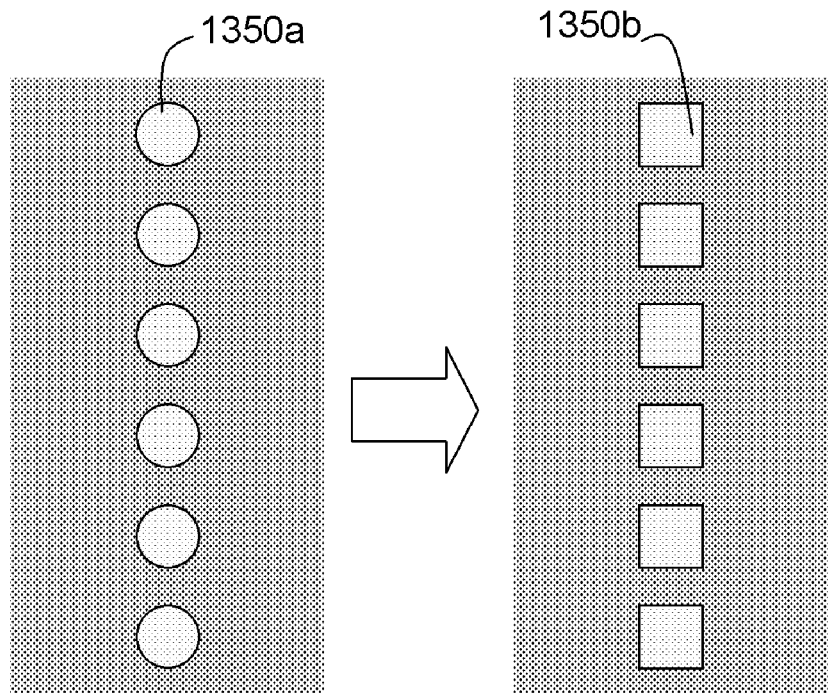
FIG. 13A illustrates various shaped apertures (e.g., circle and square).

As mentioned previously, apertures in exemplary embodiments can be deliberately fabricated in different shapes. For example FIG. 13A illustrates a comparison between a first set of apertures 1350a of a first linear aperture array and a second set of apertures 1350b of a second linear aperture array. The first set of apertures has a circular shape while the second set of apertures has a square shape.

Figure 13B:
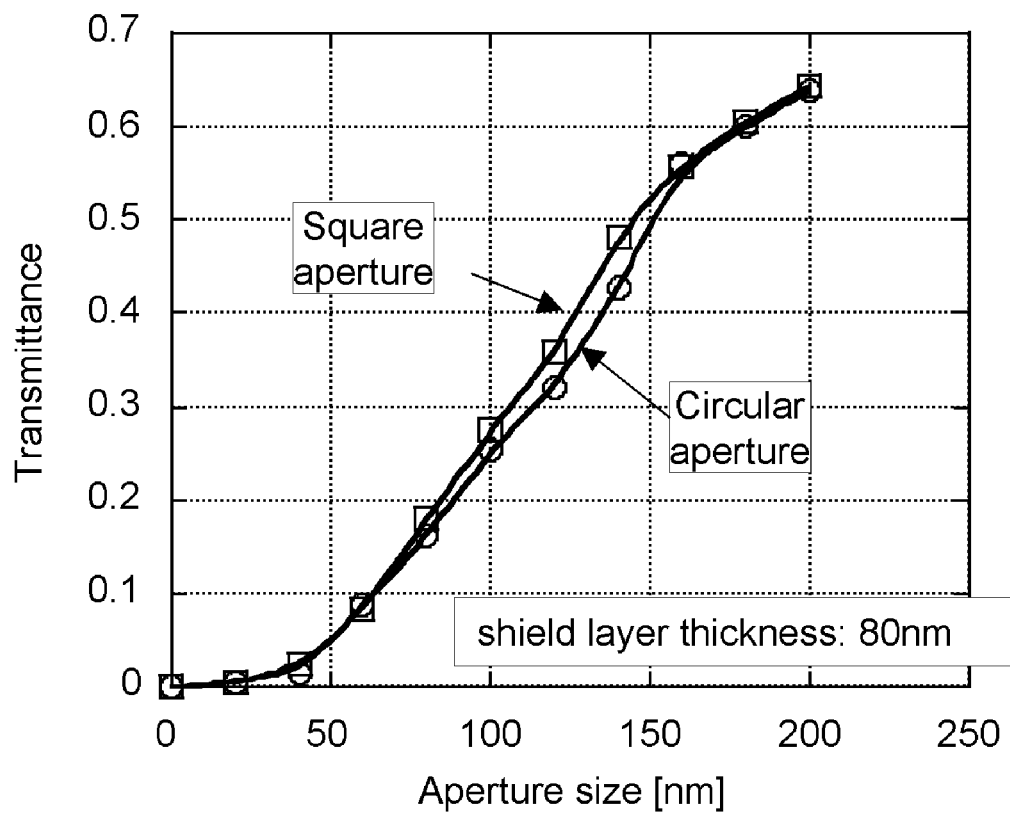
FIG. 13B illustrates the total transmittance through the various shaped apertures illustrated in FIG. 13A.

FIG. 13B illustrates the transmittance comparison between the two different shapes of apertures. As illustrated the square aperture has a higher transmittance level as a function of aperture size, where the aperture size is measured as a side of the square or the diameter of the circle. In addition to simple shapes, apertures can take the form of more complicated shapes.

Figure 13C:
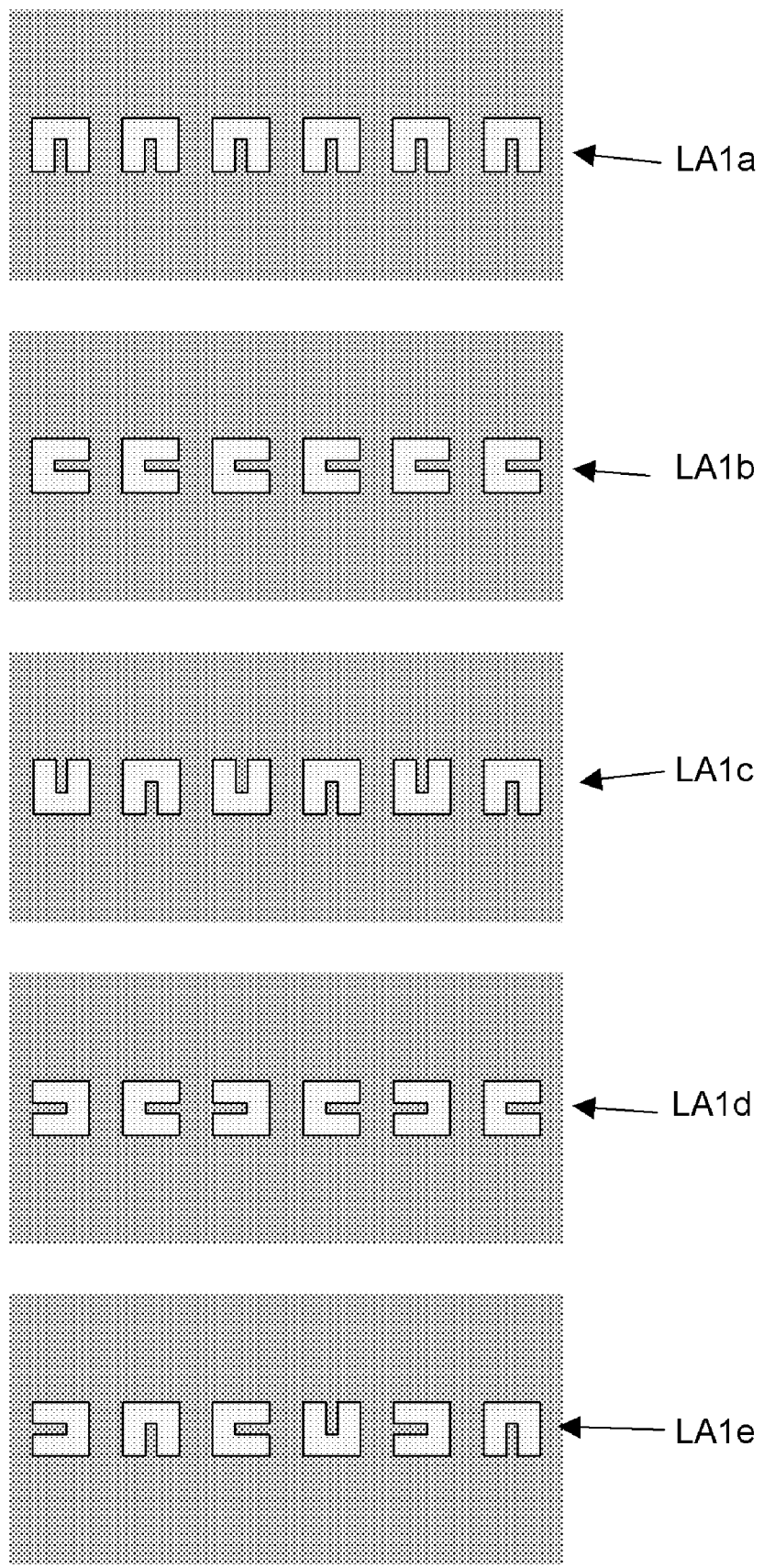
FIG. 13C illustrates various apertures shapes and sizes in accordance with at least one exemplary embodiment.

FIG. 13C illustrates an example of various complicated aperture shapes associated with particular linear aperture arrays (LA1a-e). Other than a simple square shape, more peculiar shapes may be applied. For example, it is known that a "C-shaped" aperture shows higher transmittance than a circular or a square aperture under certain circumstances. For detailed properties of a C-shaped aperture, "Ultrahigh light transmission through a C-shaped nanoaperture", Optics Letters, Vol. 28, No. 15 (2003) by Xiaolei Shi, etc. can be referred to. Linear arrays LA1a-e illustrate various orientations of C-Shaped apertures in accordance with at least one exemplary embodiment.

Figure 14:
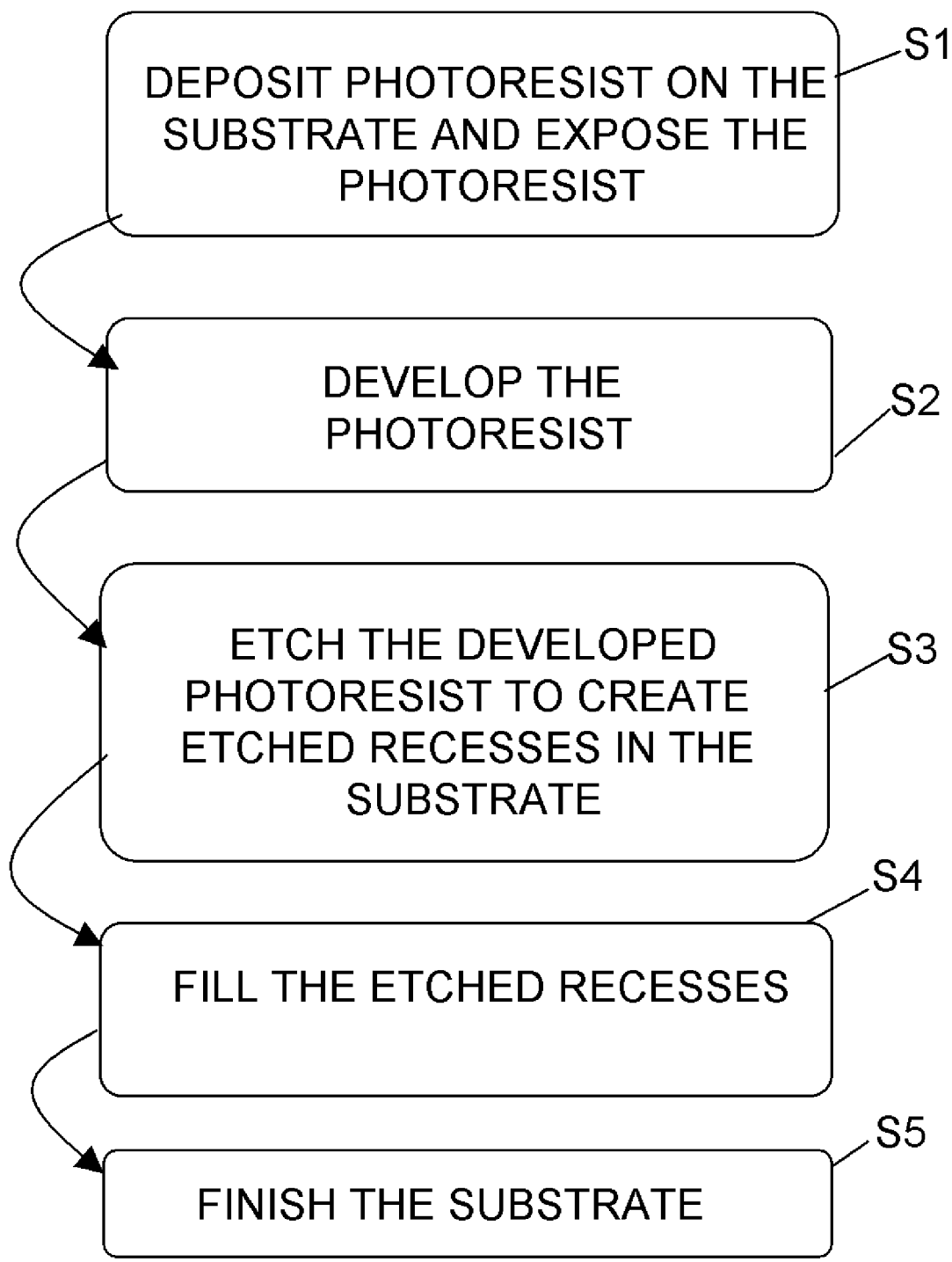
FIG. 14 illustrates a first example of a method of fabricating a detection aperture array in accordance with at least one exemplary embodiment.

FIG. 14 illustrates a method of fabrication of an aperture array in accordance with at least one exemplary embodiment. First a photoresist is deposited on a substrate (S1) that is composed of a supporting substrate and shield layer. A photoresist (e.g., positive or negative photoresist) is deposited and exposed on the substrate using illumination and a reticle as described generally above in the background section. The reticle has a pattern corresponding to the desired aperture array. The exposed photoresist is then developed (S2) and etched (S3) to form etched recesses in the shield layer of the substrate corresponding to apertures in an aperture array. The recesses are filled or partially filled (S4) with a material to vary the recess's index of refraction to a designed value. The excess material on the surface of the substrate is removed (e.g., finished S5) and the filled material removed if extending beyond the recess so that the surface is generally planar.

At least one exemplary embodiment can have at least one aperture filled with at least one of AlN, SiO2, Cr2O3, HfO2, and Si3N4.

A detector aperture array in accordance with exemplary embodiments can use various materials, for example Cr, Si, Mo, Ta, W, Rh, MoN, NbN, other materials as known by one of ordinary skill in the relevant art and equivalents.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions. For example, if words such as "orthogonal", "perpendicular" are used the intended meaning is "substantially orthogonal" and "substantially perpendicular" respectively. Additionally although specific numbers may be quoted in the claims, it is intended that a number close to the one stated is also within the intended scope, i.e. any stated number (e.g., 90 degrees) should be interpreted to be "about" the value of the stated number (e.g., about 90 degrees).

What is claimed is:

1. A detection aperture array comprising:
a shield layer; and
a plurality of apertures, wherein the plurality of apertures are formed in the shield layer and filled with a first medium having an effective index of refraction, wherein the plurality of apertures includes at least two apertures separated by a pitch, wherein the plurality of apertures has a measurement value wherein the measurement value includes at least one of the effective refractive index and a pitch value, wherein the measurement value is changed so that TM and TE modes in incident image light passes through the plurality of apertures with about the same transmittance level, wherein when the measurement value is the pitch value then the TM and TE transmittance level are about the same when an angle of incidence of an image light varies, wherein the effective index of refraction is higher than 1.

2. The detection aperture array according to claim 1, wherein the plurality of apertures are arranged in a linear 1-D array.

3. The detection aperture array according to claim 1, wherein the plurality of apertures are arranged in a 2-D array of at least two linear 1-D arrays.

4. The detection aperture array according to claim 3, wherein the at least two linear 1-D arrays are substantially parallel to each other.

5. The detection aperture array according to claim 1, wherein the at least two apertures have different comparative sizes.

6. The detection aperture array according to claim 1, wherein the first medium is at least one of SiO2, LiF, MgF2, AlN, Cr2O3, HfO2, and Si3N4.

7. The detection aperture array according to claim 1, wherein the shield layer is made from a shield medium, wherein the shield medium is at least one of Cr, Si, Mo, Ta, W, Rh, MoN, and NbN.

8. The detection aperture according to claim 7, wherein the thickness of the shield layer is between 25 and 160 nm.

9. The detection aperture according to claim 8, wherein the shield medium is chosen based upon which material provides a lower transmission of TE and TM polarized light through the shield layer for a given thickness.

10. The detection aperture array according to claim 1, further comprising:
a support substrate, wherein the support substrate is operatively connected to one side of the shield layer, and wherein the index of refraction of the support substrate is less than the effective index of refraction.

11. A detection aperture array comprising:
a shield layer; and
a plurality of apertures, wherein the plurality of apertures are formed in the shield layer and filled with a first medium having an effective index of refraction, wherein the plurality of apertures includes at least two apertures separated by a pitch, wherein the plurality of apertures has a measurement value wherein the measurement value includes at least one of the effective refractive index and a pitch value, wherein the measurement value is changed so that TM and TE modes in incident image light passes through the plurality of apertures with about the same transmittance level, wherein when the measurement value is the pitch value then the TM and TE transmittance level are about the same when an angle of incidence of an image light varies, wherein the at least two apertures have different comparative shapes or different comparative sizes.

12. A detection aperture array comprising:
a shield layer; and
a plurality of apertures, wherein the plurality of apertures are formed in the shield layer and filled with a first medium having an effective index of refraction, wherein the plurality of apertures includes at least two apertures separated by a pitch, wherein the plurality of apertures has a measurement value wherein the measurement value includes at least one of the effective refractive index and a pitch value, wherein the measurement value is changed so that TM and TE modes in incident image light passes through the plurality of apertures with about the same transmittance level, wherein when the measurement value is the pitch value then the TM and TE transmittance level are about the same when an angle of incidence of an image light varies, wherein the plurality of apertures are arranged in a 2-D array of at least two linear 1-D arrays, wherein the at least two linear 1-D arrays are substantially parallel to each other, wherein a first linear 1-D array and a second linear 1-D array of the 2-D array, include a respective first set of apertures and a second set of apertures, wherein the first set of apertures are offset with respect to the second set of apertures.

13. The detection aperture away according to claim 12, wherein the first set of apertures includes individual apertures separated by a pitch greater than 100 nm.

14. The detection aperture away according to claim 13, wherein the individual apertures of the first set of apertures have a size between 24 nm and about 200 nm.

* * * * *